(12) United States Patent
Green et al.

(10) Patent No.: US 10,541,324 B2
(45) Date of Patent: Jan. 21, 2020

(54) SEMICONDUCTOR DEVICE WITH A RECESSED OHMIC CONTACT AND METHODS OF FABRICATION

(71) Applicant: NXP USA, Inc., Austin, TX (US)

(72) Inventors: Bruce M. Green, Gilbert, AZ (US); Darrell G. Hill, Chandler, AZ (US); Karen E. Moore, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/627,143

(22) Filed: Jun. 19, 2017

(65) Prior Publication Data

US 2017/0294531 A1    Oct. 12, 2017

Related U.S. Application Data

(63) Continuation of application No. 14/084,335, filed on Nov. 19, 2013, now Pat. No. 9,685,345.

(51) Int. Cl.
*H01L 29/778* (2006.01)
*H01L 29/872* (2006.01)
(Continued)

(52) U.S. Cl.
CPC ...... *H01L 29/7787* (2013.01); *H01L 21/0272* (2013.01); *H01L 21/31111* (2013.01); *H01L 23/544* (2013.01); *H01L 27/0605* (2013.01); *H01L 27/095* (2013.01); *H01L 29/2003* (2013.01); *H01L 29/475* (2013.01); *H01L 29/66143* (2013.01); *H01L 29/66431* (2013.01); *H01L 29/812* (2013.01); *H01L 29/872* (2013.01); *H01L 2223/54426* (2013.01); *H01L 2924/0002* (2013.01)

(58) Field of Classification Search
CPC ......... H01L 21/28587; H01L 29/41766; H01L 29/66462; H01L 29/7787; H01L 29/7786; H01L 29/778; H01L 29/812; H01L 29/8128; H01L 23/544; H01L 2223/54426; H01L 29/205; H01L 29/432
See application file for complete search history.

(56) References Cited

U.S. PATENT DOCUMENTS

2007/0241419 A1* 10/2007 Green .................. H01L 23/544
                                                                257/499
2011/0210377 A1*  9/2011 Haeberlen ........... H01L 29/2003
                                                                257/194
(Continued)

*Primary Examiner* — Frederick B Hargrove
(74) *Attorney, Agent, or Firm* — Bruce M. Green

(57) ABSTRACT

An embodiment of a semiconductor device includes a semiconductor substrate that includes a host substrate, a buffer layer that includes at least one additional layer formed over the substrate, a channel layer formed over the buffer layer, a barrier layer formed over the channel layer forming a channel, a gate electrode disposed over the substrate electrically coupled to the channel, and an ohmic contact recessed into the barrier layer. A method for fabricating the semiconductor device includes forming a semiconductor substrate that includes a mixed crystal layer, creating an isolation region that defines an active region along an upper surface of the semiconductor substrate, forming a gate electrode over the semiconductor substrate in the active region, and recessing an ohmic contact into the semiconductor substrate.

15 Claims, 16 Drawing Sheets

(51) Int. Cl.
  *H01L 29/66*   (2006.01)
  *H01L 23/544*  (2006.01)
  *H01L 29/47*   (2006.01)
  *H01L 29/20*   (2006.01)
  *H01L 21/311*  (2006.01)
  *H01L 27/06*   (2006.01)
  *H01L 27/095*  (2006.01)
  *H01L 21/027*  (2006.01)
  *H01L 29/812*  (2006.01)

(56) References Cited

U.S. PATENT DOCUMENTS

| | | | |
|---|---|---|---|
| 2012/0156836 A1* | 6/2012 | Shealy | H01L 21/02145 |
| | | | 438/172 |
| 2013/0168685 A1* | 7/2013 | Hsu | H01L 29/267 |
| | | | 257/76 |
| 2013/0248873 A1* | 9/2013 | Kuraguchi | H01L 29/812 |
| | | | 257/76 |
| 2014/0077266 A1* | 3/2014 | Ramdani | H01L 29/513 |
| | | | 257/194 |
| 2014/0097470 A1* | 4/2014 | Kim | H01L 29/66462 |
| | | | 257/194 |

\* cited by examiner

SEMICONDUCTOR DEVICE WITH A RECESSED OHMIC CONTACT AND METHODS OF FABRICATION

RELATED APPLICATION

This application is a continuation of U.S. patent application Ser. No. 14/084,335, filed on Nov. 19, 2013, entitled "Semiconductor Devices with Integrated Schottky Diodes and Methods of Fabrication," which is incorporated herein by reference in its entirety.

TECHNICAL FIELD

Embodiments of the subject matter described herein relate generally to semiconductor devices with integrated Schottky diodes and methods for fabricating such devices.

BACKGROUND

High speed microwave field effect transistors and Schottky diodes find application in high efficiency amplifiers (HEA's) and other microwave integrated circuit applications. Microwave field effect transistors include aluminum gallium nitride/gallium nitride heterojunction field effect transistors (AlGaN/GaN HFET's), gallium arsenide pseudomorphic high electron mobility transistors (GaAs pHEMT's), gallium arsenide metal-semiconductor field effect transistors (GaAs MESFET's), and silicon laterally diffused metal-oxide semiconductor (Si-LDMOS) transistors. High efficiency amplifiers operate in class B, class C, class D, class E, class F, inverse class F, and class S modes of operation. Theoretical efficiencies for these modes of operation may approach 100%. These classes of microwave power amplifier operation generally amplify waveforms wherein non-zero voltage and current do not simultaneously appear on the drains of amplifier final stage transistors. Non-overlapping voltages and currents require the transistors to operate in "switch-mode." This means that the current that passes through such a transistor has a square wave shape. Therefore, the transistor must be able to have high current gain not only at the fundamental frequency, but at harmonic frequencies of the fundamental frequency so that square waves can be generated by the transistor. Maintaining high current gain at the fundamental and harmonic frequencies requires that the transistor have has a high unity gain cutoff frequency ($f_T$). For example an HEA operating in a switch-mode of operation at a fundamental frequency of 4 gigahertz (GHz) may require greater than unity current gain at frequencies that exceed 40 GHz. Therefore a transistor with a $f_T$ of greater than 40 GHz is required for such an application.

Schottky diodes find applications in microwave circuits for detection, circuit protection, level shifting, switching, and other applications. In HEA's, Schottky diodes are particularly useful for protecting from over-voltage conditions due to inductive ringing or other transient effects when connected to the drains of field effect transistors. Depending on the application, power, and frequency level, designers may use submicron gate AlGaN/GaN HFET's, GaAs pHEMT's, GaAs MESFET's, or Si-LDMOS devices in conjunction with Schottky diode devices to realize HEA's. The transistor devices may be fabricated using electron-beam lithography techniques. Accordingly, designers desire structures and methods that increase the functionality and manufacturing ease of such devices.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Figure 1:
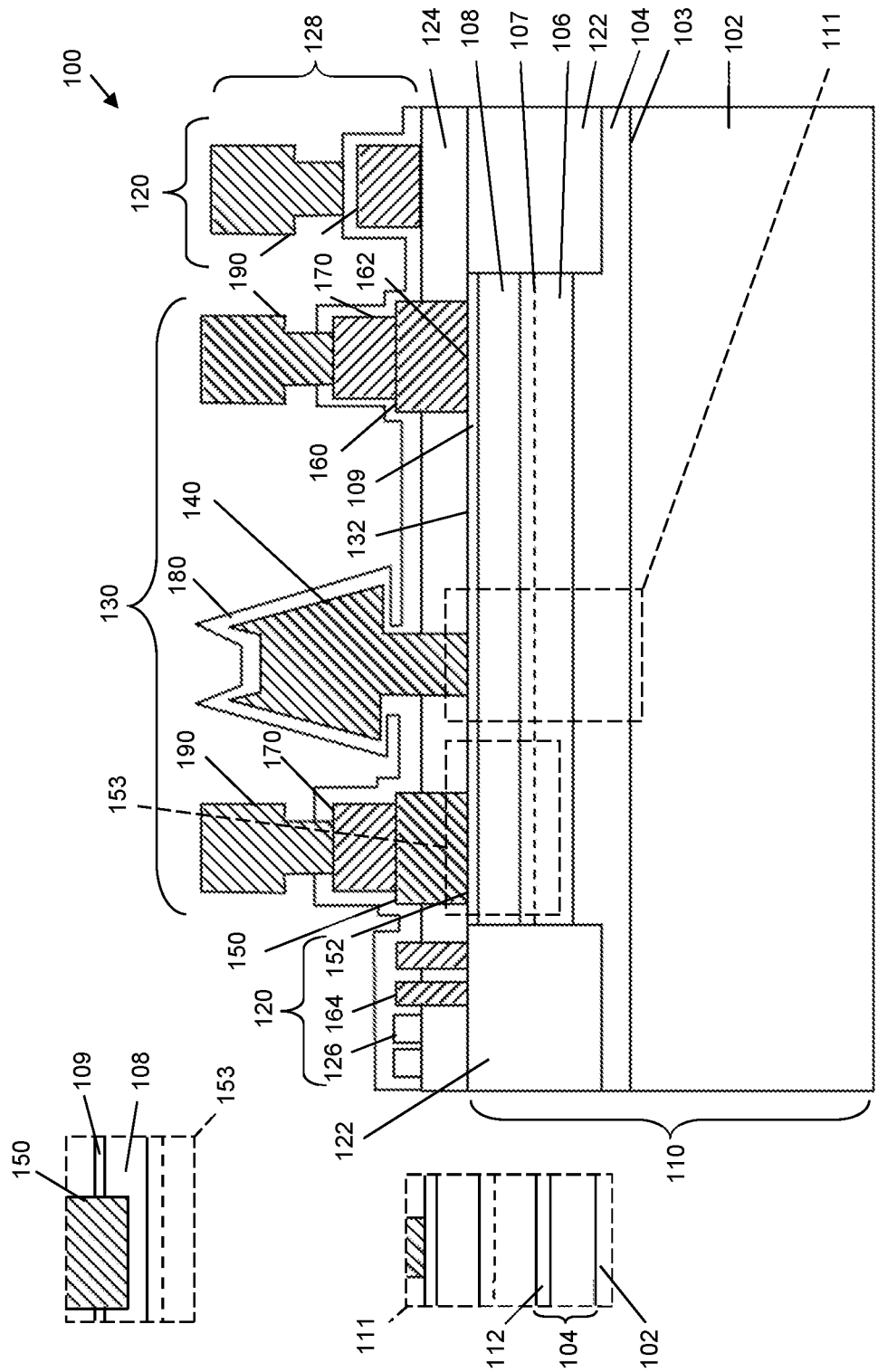
FIG. 1 is a cross-sectional, side view of a GaN transistor device with an integrated Schottky diode in accordance with an embodiment.

FIG. 1 is a cross-sectional, side view of an exemplary GaN transistor device 100 with an integrated Schottky diode in accordance with an embodiment. In an embodiment, the transistor device 100 includes a semiconductor substrate 110, an isolation region 120, a first dielectric layer 124, an active region 130, a gate electrode 140, an ohmic contact 150, one or more alignment marks 164, a Schottky contact 160, first metal electrodes 170, a second dielectric layer 180, and second metal electrodes 190. As is described more fully below, the GaN transistor device 100 is substantially contained within the active region 130 with gate electrode 140, ohmic contact 150, and Schottky contact 160 over semiconductor substrate 110, and an isolation region 120 with alignment marks 164 formed over semiconductor substrate 110 in an isolation region 120. According to an embodiment, the Schottky contact 160 and alignment marks 164 are formed from the same Schottky metal layer.

The semiconductor substrate 110 may include a host substrate 102, a buffer layer 104, a channel layer 106, a barrier layer 108, and a cap layer 109. In an embodiment, the host substrate 102 includes silicon carbide (SiC). In other embodiments, the host substrate 102 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials. The buffer layer 104 is formed on upper surface 103 of the host substrate 102. The buffer layer 104 may include a number of group III-N semiconductor layers and is supported by the host substrate 102. Each of the semiconductor layers of the buffer layer 104 may include an epitaxially grown group III-nitride eptiaxial layer. The group-III nitride epitaxially layers that make up the buffer layer 104 may be nitrogen (N)-face or gallium (Ga)-face material, for example. In other embodiments, the semiconductor layers of the buffer layer 104 may not be epitaxially grown. In still other embodiments, the semiconductor layers of the buffer layer 104 may include Si, GaAs, InP, or other suitable materials.

In an embodiment, the buffer layer 104 is grown epitaxially on the host substrate 102. The buffer layer 104 may include at least one AlGaN mixed crystal layer having a composition denoted by $Al_xGa_{1-x}N$ with an aluminum mole fraction, X, that can take on values between 0 and 1. The total thickness of the buffer layer 104 with all of its layers may be between about 200 angstroms and about 100,000 angstroms although other thicknesses may be used. A limiting X value of 0 yields pure GaN while a value of 1 yields pure aluminum nitride (AlN). An embodiment includes a buffer layer 104 that may include a nucleation region comprised of AlN. The nucleation region starts at the interface between the host substrate 102 and the buffer layer 104 and extends about 100 angstroms to about 2000 angstroms into the buffer layer 104. As shown in view 111, the buffer layer 104 may include additional layers 112, such as $Al_xGa_{1-x}N$ layers formed over the nucleation region. The thickness of the additional layers 112 (e.g., $Al_xGa_{1-x}N$ layer(s) may be between about 200 angstroms and about 50,000 angstroms though other thicknesses may be used. In an embodiment, the additional $Al_xGa_{1-x}N$ layers may be configured as GaN (X=0) where the $Al_xGa_{1-x}N$ is not intentionally doped (NID). The additional $Al_xGa_{1-x}N$ layers may also be configured as one or more GaN layers where the one or more GaN layers are intentionally doped with dopants that may include iron (Fe), chromium (Cr), carbon (C) or other suitable dopants that render the buffer layer 104 substantially insulating or high resistivity. The dopant concentration may be between about 1017 and 1019 $cm^{-3}$ though other higher or lower concentrations may be used. The additional $Al_xGa_{1-x}N$ layers may be configured with X=0.01 to 0.10 where the $Al_xGa_{1-x}N$ is NID or, alternatively, where the $Al_xGa_{1-x}N$ is intentionally doped with Fe, Cr, C, or other suitable dopant species. In other embodiments, the additional layers may be configured as a superlattice where the additional layers include a series of alternating NID or doped $Al_xGa_{1-x}N$ layers where the value of X takes a value between 0 and 1. In still other embodiments, and as shown in view 111, the buffer layer 104 may also include one or more additional layers 112, such as indium gallium nitride (InGaN) layers, with composition denoted $In_yGa_{1-y}N$, where Y, the indium mole fraction, may take a value between 0 and 1. The thickness of the InGaN layer(s) may be between about 50 angstroms and about 2000angstroms though other thicknesses may be used.

In an embodiment, a channel layer 106 is formed over the buffer layer 104. The channel layer 106 may include one or more group III-N semiconductor layers and is supported by the buffer layer 104. The channel layer 106 may include an $Al_xGa_{1-x}N$ layer where X takes on values between 0 and 1. In an embodiment, the channel layer 106 is configured as GaN (X=0) although other values of X may be used without departing from the scope of the inventive subject matter. The thickness of the channel layer 106 may be between about 50 angstroms and about 10,000 angstroms though other thicknesses may be used. The channel layer 106 may be NID or, alternatively, may include Si, germanium (Ge), C, Fe, Cr, or other suitable dopants. The dopant concentration may be between about $10^{16}$ and about $10^{19}$ $cm^{-3}$ though other higher or lower concentrations may be used. In other embodiments, the channel layer may include NID or doped $In_yGa_{1-y}N$, where Y, the indium mole fraction, may take a value between 0 and 1.

A barrier layer 108 is formed over the channel layer 106 in accordance with an embodiment. The barrier layer 108 may include one or more group III-N semiconductor layers and is supported by the channel layer 106. In some embodiments, the barrier layer 108 has a larger bandgap and larger spontaneous polarization than the channel layer 106 and, when the barrier layer 108 is in direct contact with the channel layer 106, a channel 107 is created in the form of a two dimensional electron gas (2-DEG) within the channel layer 106 near the interface between the channel layer 106 and barrier layer 108. In addition, strain between the barrier layer 108 and channel layer 106 may cause additional piezoelectric charge to be introduced into the 2-DEG and channel. The barrier layer 108 may include at least one NID $Al_xGa_{1-x}N$ layer where X takes on values between 0 and 1. In some embodiments, X may take a value of 0.1 to 0.35, although other values of X may be used. The thickness of the barrier layer 108 may be between about 50 angstroms and about 1000 angstroms though other thicknesses may be used. The barrier layer 108 may be NID or, alternatively, may include Si, Ge, C, Fe, Cr, or other suitable dopants. The dopant concentration may be between about $10^{16}$ and $10^{19}$ $cm^{-3}$ though other higher or lower concentrations may be used. There may be an additional AlN interbarrier layer (not shown) formed between the channel layer 106 and the barrier layer 108, in some embodiments. The AlN interbarrier layer may increase the channel charge and improve the electron confinement of the resultant 2-DEG. In other embodiments, the barrier layer 108 may include indium aluminum nitride (InAlN) layers, denoted $In_yAl_{1-y}N$, where Y, the indium mole fraction, may take a value between about 0.1 and about 0.2 though other values of Y may be used. In the case of an InAlN barrier, the thickness of the barrier layer 108 may be between about 50 angstroms and about 2000 angstroms though other thicknesses may be used. In the case of using InAlN to form the barrier layer 108, the InAlN may be NID or, alternatively, may include Si, Ge, C, Fe, Cr, or other suitable dopants. The dopant concentration may be between about $10^{16}$ and about $10^{19}$ $cm^{-3}$ though other higher or lower concentrations may be used.

In an embodiment illustrated in FIG. 1, a cap layer 109 may be formed over the barrier layer 108. The cap layer 109 presents a stable surface for the semiconductor substrate 110 and serves to protect the surface of the semiconductor substrate 110 from chemical and environmental exposure incidental to wafer processing. The cap layer 109 may include one or more group III-N semiconductor layers and is supported by the barrier layer 108. In an embodiment, the cap layer 109 is GaN. The thickness of the cap layer 109 may be between about 5 angstroms and about 100 angstroms though other thicknesses may be used. The cap layer 109 may be NID or, alternatively, may include Si, Ge, C, Fe, Cr, or other suitable dopants. The dopant concentration may be between about $10^{16}$ and $10^{19}$ $cm^{-3}$ though other higher or lower concentrations may be used. Without departing from the scope of the inventive subject matter, it should be appreciated that the choice of materials and arrangement of layers to form semiconductor substrate 110 is exemplary. The inclusion of the host substrate 102, a buffer layer 104, a channel layer 106, a barrier layer 108, and a cap layer 109 into the semiconductor substrate 110 is exemplary and that the function and operation of the various layers may be combined and may change depending on the materials used in any specific embodiment. In other embodiments using N-polar materials (not shown) the channel layer 106 may be disposed over the barrier layer 108 to create a 2-DEG and channel directly underneath an optional cap 109 and gate electrode 140. Still further embodiments may include semiconductor layers formed from materials including GaAs, aluminum gallium arsenide (AlGaAs), indium gallium arsenide (InGaAs), and aluminum indium arsenide (AlInAs) to form the semiconductor substrate 110.

One or more isolation regions 120 may be formed in the semiconductor substrate 110 to define an active region 130 along upper surface 132 of the semiconductor substrate 110, according to an embodiment. The isolation regions 120 may be formed via an implantation procedure configured to damage the epitaxial and/or other semiconductor layers to create high resistivity regions 122 of the semiconductor substrate 110 rendering the semiconductor substrate 110 high resistivity or semi-insulating in those high resistivity regions 122 while leaving the crystal structure intact in the active region 130. In other embodiments, the isolation regions 120 may be formed by removing one or more of the epitaxial and/or other semiconductor layers of the semiconductor substrate 110 rendering the remaining layers of the semiconductor substrate 110 semi-insulating and leaving behind active region 130 "mesas" surrounded by high resistivity or semi-insulating isolation regions 120. In an embodiment, a first dielectric layer 124 may be formed over the active region 130 and isolation regions 120. Initial alignment marks 126, alignment marks 164, and passive structures such as metal-insulator-metal (MIM) capacitors 128, metal traces, inductors, and other structures may be formed in the isolation regions 120 and supported by the semiconductor substrate 110.

Figure 13:
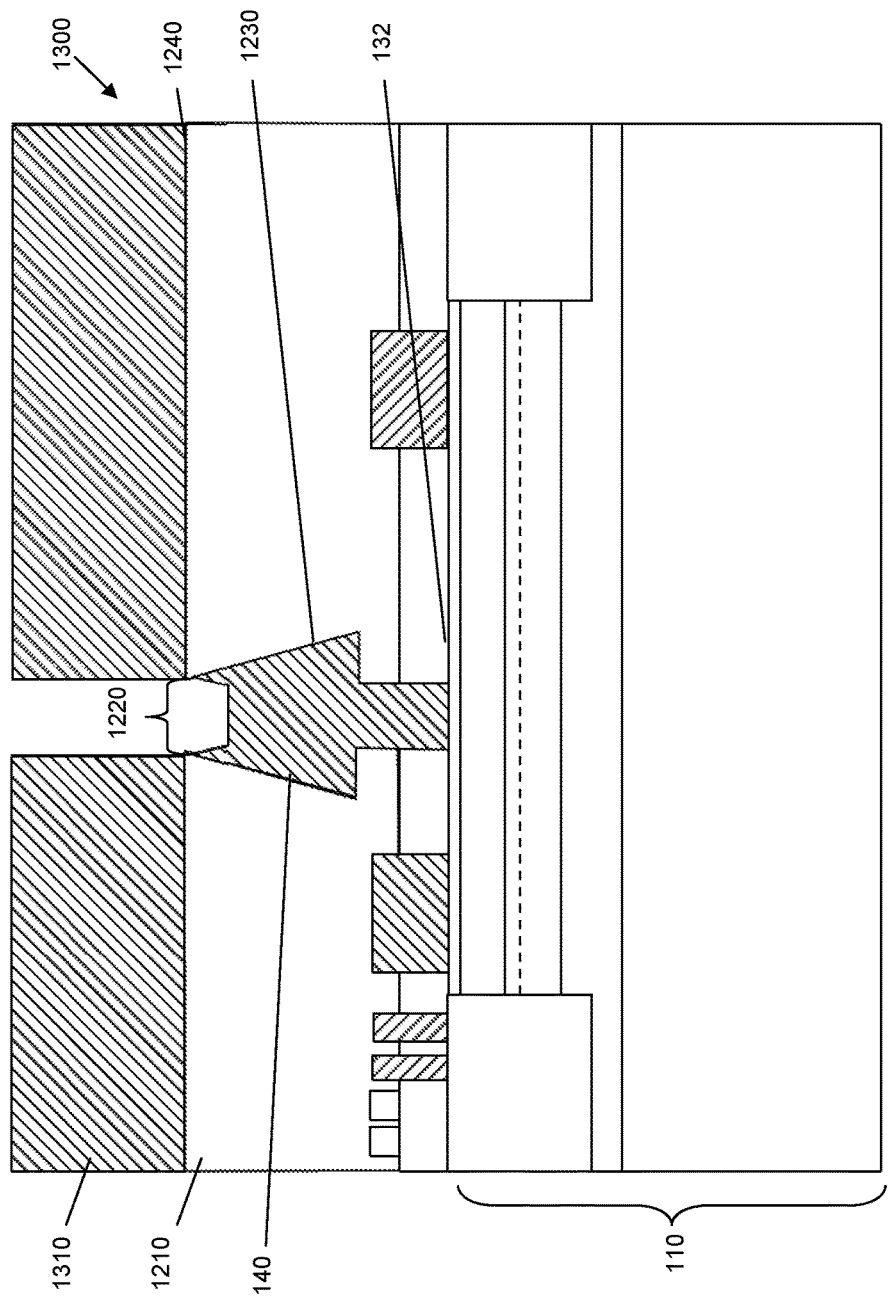

In an embodiment, the gate electrode 140 is formed over the semiconductor substrate 110 in the active region 130. The gate electrode 140 is electrically coupled to the channel 107 through the cap layer 109 and barrier layer 108. Changes to the electric potential on the gate electrode 140 shifts the quasi Fermi level for the barrier layer 108 compared to the quasi Fermi level for the channel layer 106 and thereby modulates the electron concentration in the channel 107 within the semiconductor substrate 110 under the gate electrode 140. In this embodiment, the gate electrode 140 is configured as a Schottky gate and may be formed over and directly in contact with the cap layer 109 of the semiconductor substrate 110 using a Schottky material layer and a conductive metal layer. A conductive low stress metal is deposited over the Schottky material layer to form gate electrode 140, in an embodiment. The gate electrode 140 may be T-shaped with a vertical stem as shown or may be a square shape in other embodiments. In other embodiments, the gate electrode 140 may be recessed through the cap layer 109 and extend partially into the barrier layer 108, increasing the electrical coupling of the gate electrode 140 to the channel 107 through the barrier layer 108. As will be described later, in an embodiment of a method for forming the gate electrode 140, as depicted in FIG. 13 and described in conjunction with step 1300 below, Schottky or other suitable materials may be combined with highly conductively materials in a metal stack to form a Schottky gate electrode 140 for a low loss gate electrode electrically coupled to channel 107, according to an embodiment. In other embodiments, the gate electrode 140 may be formed over a gate dielectric or gate oxide forming a metal-insulator-semiconductor (MIS) junction or metal oxide semiconductor (MOS) junction, electrically coupling to the channel 107 through the dielectric or oxide layer.

In an embodiment, an ohmic contact 150 may be formed over and in contact with the semiconductor substrate 110 adjacent the gate electrode 140 in the active region 130. In an embodiment, the ohmic contact 150 forms an ohmic source electrode with an ohmic junction 152 to the channel 107. The ohmic contact 150 may be formed over and in contact with the cap layer 109. In other embodiments, and as shown in a view 153, the ohmic contact 150 may be recessed through the cap layer 109 and extend partially through the barrier layer 108. In still other embodiments, ion implantation may be used to form ohmic contact to the channel 107.

In an embodiment, a Schottky contact 160 may be formed over and in contact with the semiconductor substrate 110 adjacent the gate electrode 140 in the active region 130. The Schottky contact 160 may function as a drain electrode or as a source electrode, in various embodiments. In an embodiment, the Schottky contact 160 forms a Schottky junction 162 with the channel 107 thus acting as a Schottky diode incorporated into the drain electrode. In an embodiment, the Schottky contact 160 (or the drain or source electrode) may be formed over and in contact with the cap layer 109 to form Schottky junction 162. In other embodiments, the Schottky contact 160 (or the drain or source electrode) may be recessed through the cap layer 109 and extend partially through the barrier layer 108 to form Schottky junction 162.

Figure 10:
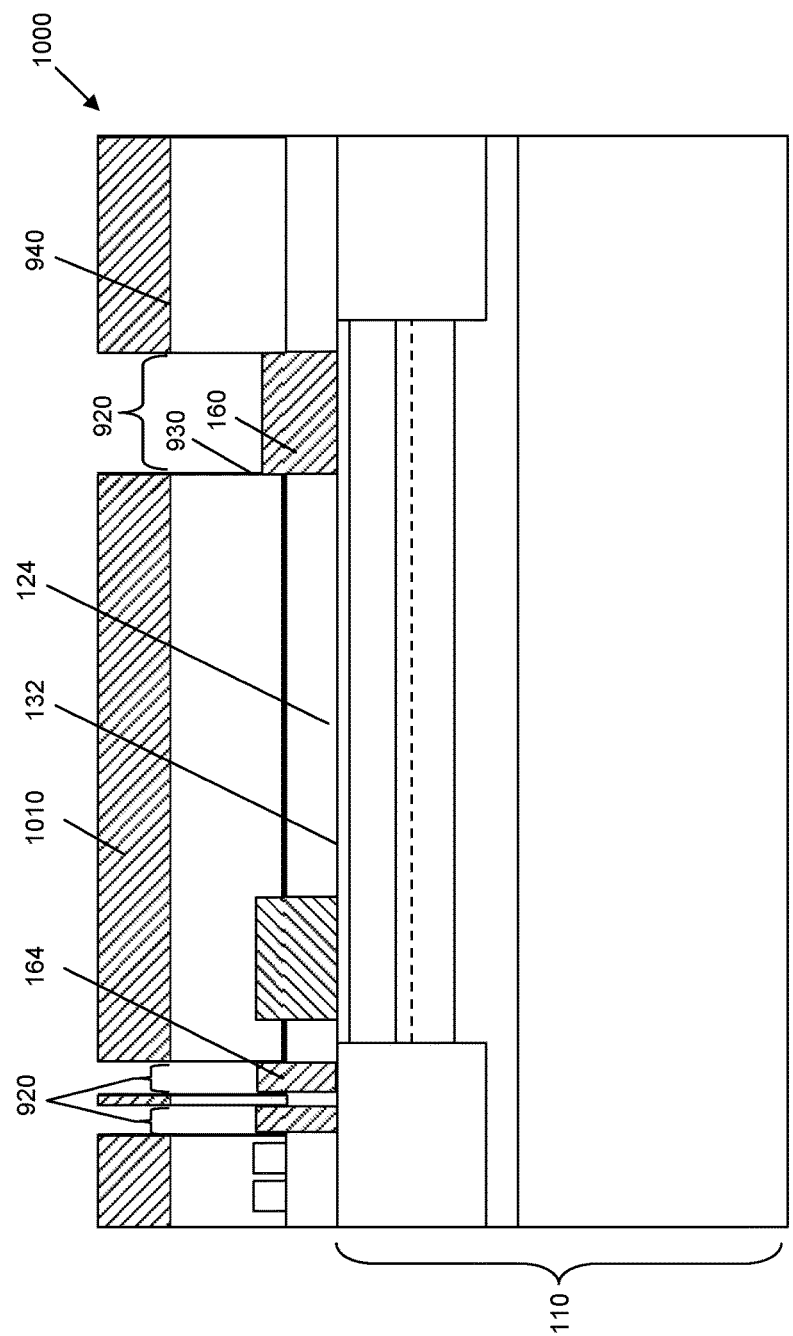

One or more alignment marks 164 may be formed over the semiconductor substrate 110 in the isolation region 120 using the same Schottky metal layer that is used to form the Schottky contact 160, according to an embodiment. During various steps in the device fabrication process, the alignment marks 164 may be used to align features such as the gate electrode 140 or other layers to previously formed layers. The alignment marks 164 may be used during either optical, electron beam, or x-ray lithography or combinations of these or other lithography techniques. The materials for the Schottky metal layer used to realize Schottky contact 160 and alignment marks 164 should be selected from materials that will provide both reliable Schottky contacts as well as the sufficient contrast for electron beam, optical, or x-ray detection of the alignment marks 164, according to an embodiment. The electron contrast is determined by the atomic number, Z, of the metal as well as by the edge acuity of the metal structures. According to an embodiment, a single Schottky metal layer simultaneously functions as both Schottky contact 160 and alignment marks 164. The Schottky metal layer may include a first material layer that contacts the semiconductor substrate 110, in an embodiment. In embodiments where the semiconductor substrate 110 includes Ga or N polar group-III nitrides, the first material layer may be chosen from those that have work functions in excess of about 4.5 electron-volts (eV). In embodiments where the semiconductor substrate 110 includes GaAs or InP, the first material layer may be chosen from those that have work functions in excess of about 4.2 electron-volts (eV). Desirably, alignment marks for electron beam lithography exhibit high electron contrast and low stress (e.g., to avoid de-lamination of the Schottky contact 160 and/or alignment mark 164). Therefore, the Schottky contact 160 and alignment marks 164 also may have a second metal layer deposited over the first material layer, where the second metal layer may include low stress metals. As will be described later, in an embodiment of a method for forming the Schottky contact 160 and alignment marks 164, as depicted in FIG. 10 and described in step 1000 below, Schottky or other suitable materials may be combined with highly conductively materials in a metal stack to form a Schottky contact 160 and alignment marks 164 for a low loss Schottky contact 160 and Schottky junction 162 coupled to channel 107, according to an embodiment. In other embodiments, metals that simultaneously have high Z and that form stable Schottky metals may be used to form the Schottky contact 160 and alignment marks 164 using a single metal layer.

Figure 14:
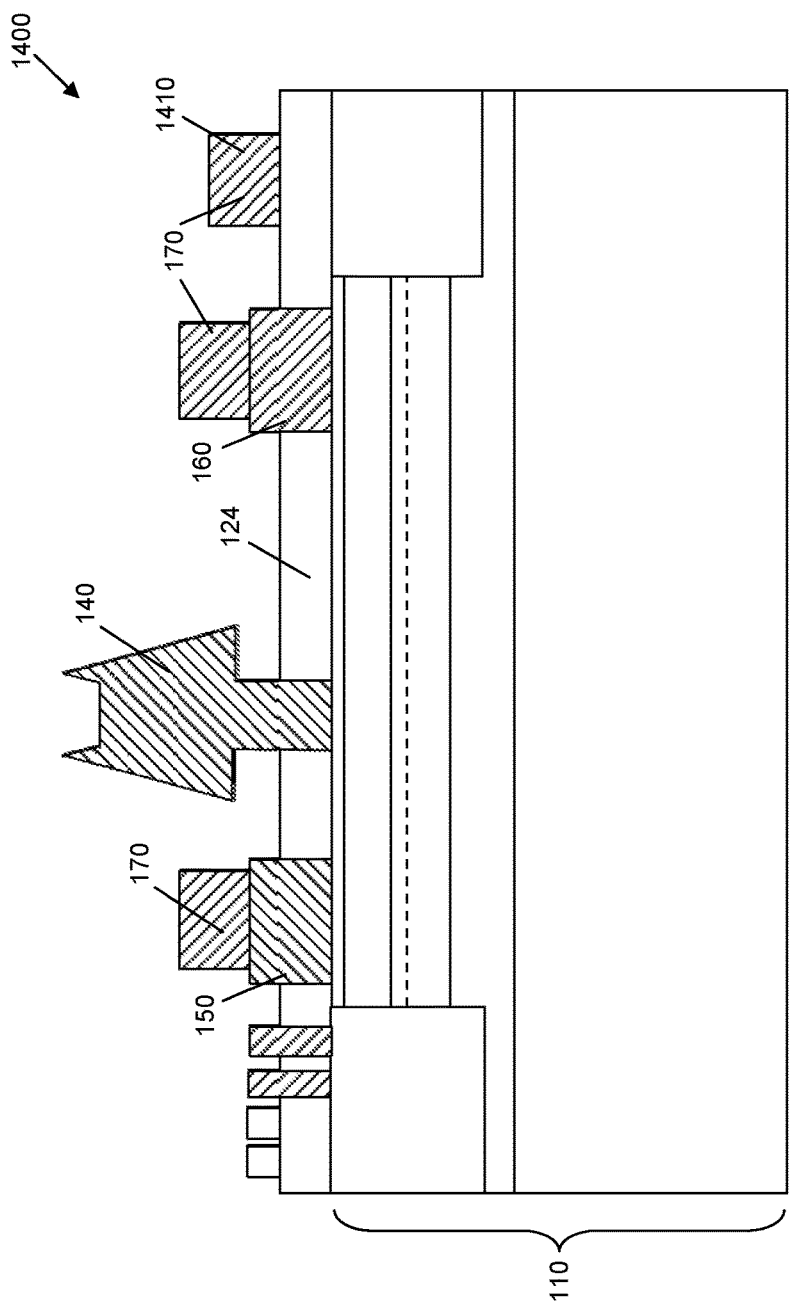

In an embodiment, first metal electrodes 170 may be formed over the semiconductor substrate 110 in both the active region 130 and the isolation regions 120. The first metal electrodes 170 are supported by the semiconductor substrate 110. In an embodiment, one of the first metal electrodes 170 may be formed over ohmic contact 150 in the active region 130, and another one of the first metal electrodes 170 may be formed over Schottky contact 160 in the active region 130. In addition, another one of the first metal electrodes 170 may be deposited over the first dielectric layer 124 in the isolation region to form the bottom plate of an MIM capacitor 128. In other embodiments, additional first metal electrodes 170 may be formed elsewhere in the isolation regions 120 to create a variety of integrated circuit components. In still other embodiments, additional first metal electrodes 170 may be formed adjacent to or over the alignment marks 164 to create structures such as MIM or inter-digitated capacitors that include more than one metal layer. In still other further embodiments (not shown), the first metal electrodes 170 may be formed over first dielectric layer 124 at points between the gate electrode 140 and drain, source or the Schottky electrode 160 to create MIS structures electrically coupled to the channel 107 that can modulate the concentration of electrons in the channel 107 of the channel layer 106 within the semiconductor substrate 110. As will be described below, in an embodiment of a method for forming the first metal electrodes 170, as depicted in FIG. 14 and described in conjunction with step 1400 below, an adhesion layer may be combined with highly conductively materials in a metal stack to form the first metal electrodes 170, according to an embodiment.

Figure 15:
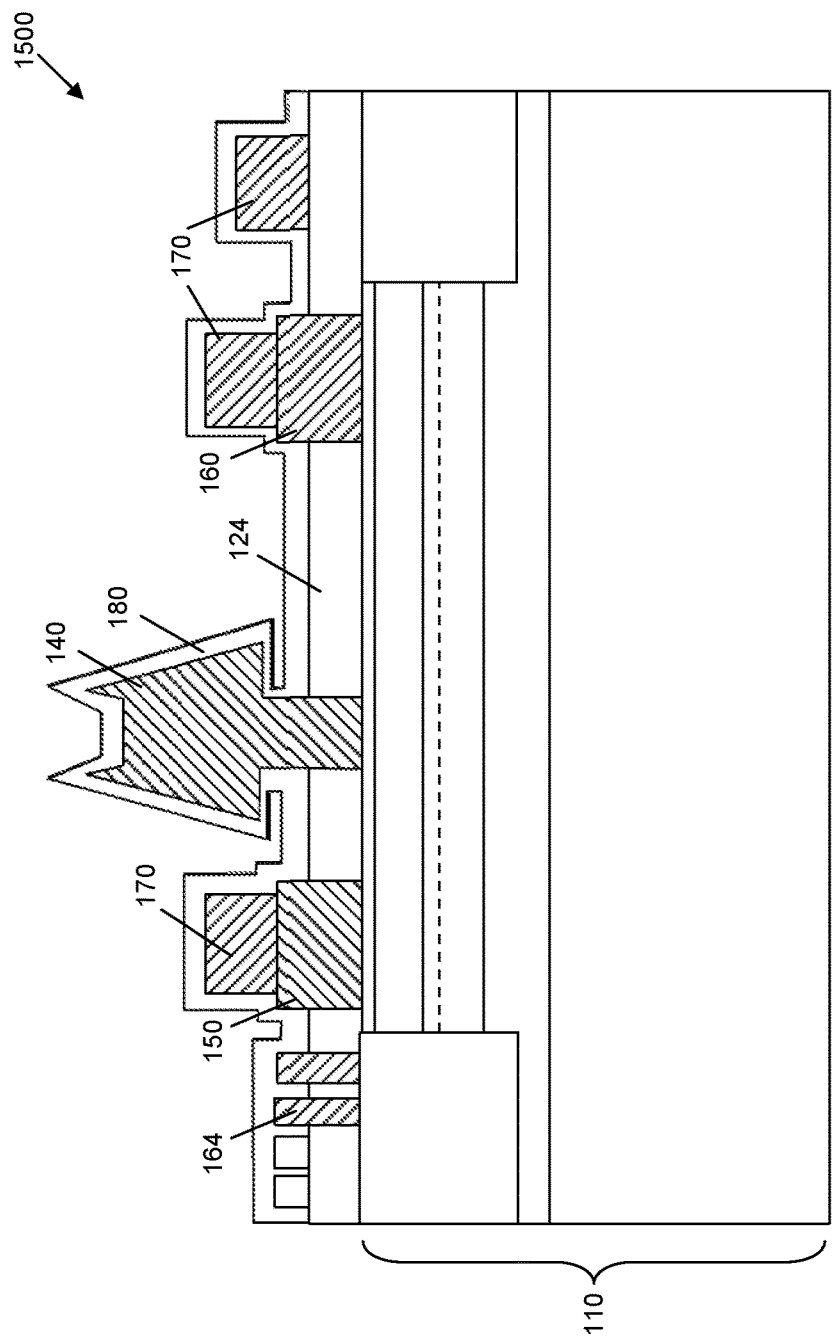

In an embodiment, the second dielectric layer 180 may be formed over the first metal electrodes 170, gate electrode 140, ohmic contact 150, and first dielectric layer 124, where the second dielectric layer 180 is supported by the semiconductor substrate 110 in the isolation regions 120 and active region 130. The second dielectric layer 180 encapsulates the active region 130 and the isolation regions 120 protecting the surface from moisture and other contaminants. The second dielectric layer 180 may also be formed over the first metal electrodes 150 in the active region 130, and over the alignment marks 126 and 164 in the isolation regions 120. The second dielectric layer 180 may be patterned by etching to provide for contacts formed using second metal electrodes 190. As will be described below, in an embodiment of a method for forming the second dielectric layer 180, as depicted in FIG. 15 and described in conjunction with step 1500 below, a variety of appropriate dielectric materials of an appropriate thickness may be used to form second dielectric layer 180, according to an embodiment.

Figure 16:
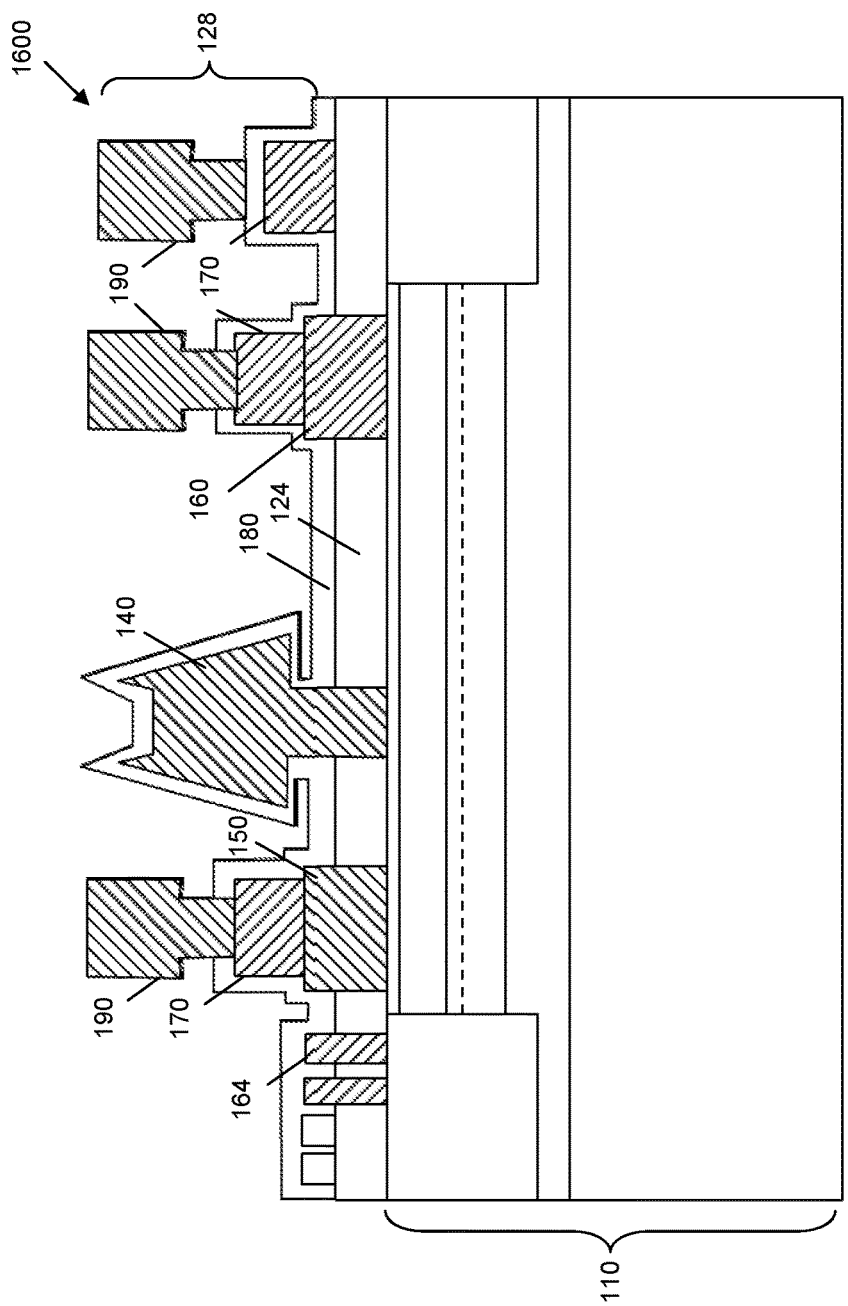

One or more second metal electrodes 190 may be formed over the second dielectric layer 180, the first metal electrodes 170, and the first dielectric layer 124, where the second metal electrodes 190 are supported by the semiconductor substrate 110, according to an embodiment. The second metal electrodes 190 may be in electrical contact with the first metal electrodes 170 through holes etched in second dielectric layer 180. In an embodiment, one of the second metal electrodes 190 may be used to form the top plate of MIM capacitor 128 formed over second dielectric layer 180, where a first metal electrode 170 forms the bottom plate of the MIM capacitor 128. As will be described below, in an embodiment of a method for forming the first metal electrodes 170, as depicted in FIG. 16 and described in conjunction with step 1600 below, an adhesion layer may be combined with highly conductively materials in a metal stack to form the second metal electrodes 180, according to an embodiment. In an embodiment, one or more additional dielectric layers (not shown) may be formed over the second metal electrodes 190, the second dielectric layer 180, and first metal electrodes 170 for moisture and chemical protection.

Figure 2:
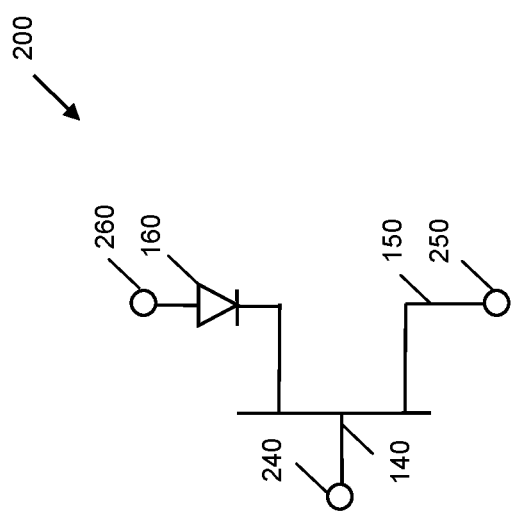
FIG. 2 is a schematic diagram of the GaN transistor device with an integrated Schottky diode, in accordance with the embodiment of FIG. 1.

FIG. 2 depicts a circuit representation 200 of the GaN transistor device 100 showing the integration of the gate electrode 140 configured to form a gate terminal 240, the ohmic contact 150 configured to form a source terminal 250, and the Schottky contact 160 configured to form a drain terminal 260, according to an embodiment. In other embodiments, one of source, drain, and gate terminals 250, 260, and 240 or a combination of these may be configured to include the Schottky contact 150. In still other embodiments, more than one Schottky contact may be electrically coupled in series and electrically coupled to one or a combination of source, drain, and gate terminals, 250, 260, and 240.

Figure 3:
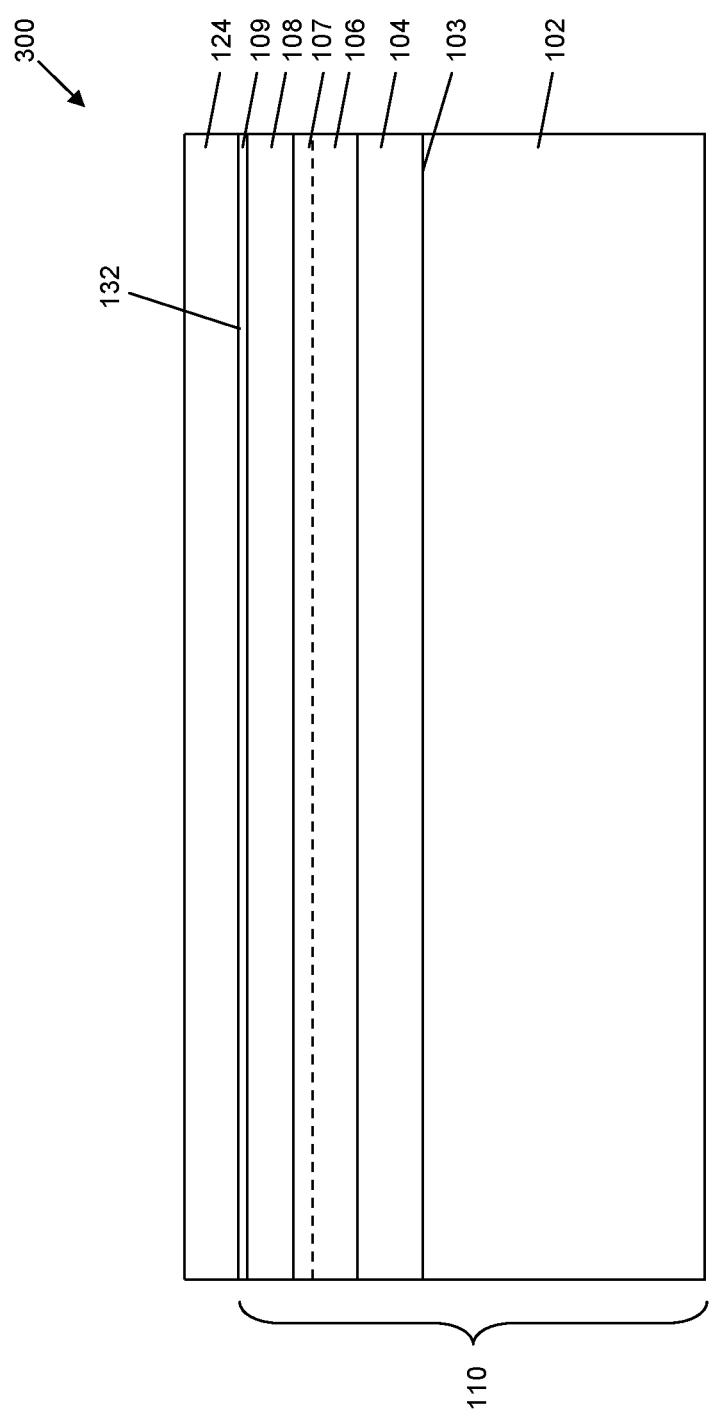
FIGS. 3-16 illustrate cross-sectional, side views of a series of fabrication steps for producing the GaN transistor device with the integrated Schottky diode of FIG. 1, in accordance with an embodiment.

FIGS. 3-16 display simplified schematic cross sectional views of a series of fabrication steps 300-1600 for forming the GaN transistor device 100 of FIG. 1, according to an embodiment. Referring first to FIG. 3, a step 300 of the method includes depositing a number of semiconductor layers 104, 106, 108, 109 on an upper surface 103 of substrate 102 to form semiconductor substrate 110 and then depositing a first dielectric layer 124 on the upper surface 132 of semiconductor substrate 110. Forming semiconductor substrate 110 includes providing host substrate 102 and depositing buffer layer 104, channel layer 106, barrier layer 108, and cap layer 109 over and on top of host substrate 102 to form semiconductor substrate 110. The host substrate 102 may include sapphire, Si, GaN, AlN, diamond, poly-SiC, Si on insulator, GaAs, InP, or other suitable materials. According to an embodiment, a buffer layer 104 may be deposited over an upper surface 103 of host substrate 102. The buffer layer 104 may include one of GaN, AlGaN, InGaN, a combination of these, or other suitable materials. According to an embodiment, a channel layer 106 may be deposited over an upper surface of buffer layer 104. The channel layer 106 may include one of GaN, AlGaN, InGaN, a combination of these, or other suitable materials. According to an embodiment, a barrier layer 108 may be deposited over the channel layer 106. The barrier layer 108 may include one of AlGaN, InAlN, a combination of these or other suitable materials. According to an embodiment, a cap layer 109 may be deposited over the barrier layer 109. The cap layer 109 may include GaN or other suitable materials. Each of the buffer layer 104, channel layer 106, barrier layer 108, and cap layer 109 may be grown over an upper surface 103 of host substrate 102 using one of metal-organo chemical vapor deposition (MOCVD), molecular beam epitaxy (MBE), hydride-vapor phase epitaxy (HVPE) or a combination of these techniques, though other suitable techniques may be used.

According to an embodiment, the method further includes depositing a first dielectric layer 124 over the upper surface of semiconductor substrate 110. The first dielectric layer 124 may include one of $Si_3N_4$, silicon dioxide ($SiO_2$), silicon oxynitride (SiON), $Al_2O_3$, hafnium dioxide ($HfO_2$), a combination of these, or other suitable insulating dielectric layers. The total thickness of the layers used to form first dielectric layer 124 may be between about 30 and about 10,000 angstroms in thickness, although other thickness values may be used. In an embodiment, the first dielectric layer 124 may be formed by depositing $Al_2O_3$ over and in contact with semiconductor substrate 110 and then depositing SiN over the $Al_2O_3$ layer. The first dielectric layer 124 may be deposited using low pressure chemical vapor deposition (LPCVD), plasma-enhanced chemical vapor deposition (PECVD), sputtering, physical vapor deposition (PVD), atomic layer deposition (ALD), catalytic chemical vapor deposition (Cat-CVD), hot-wire chemical vapor deposition (HWCVD), electron-cyclotron resonance (ECR) CVD, inductively coupled plasma (ICP) CVD, a combination of these or other suitable dielectric deposition technique(s).

Figure 4:
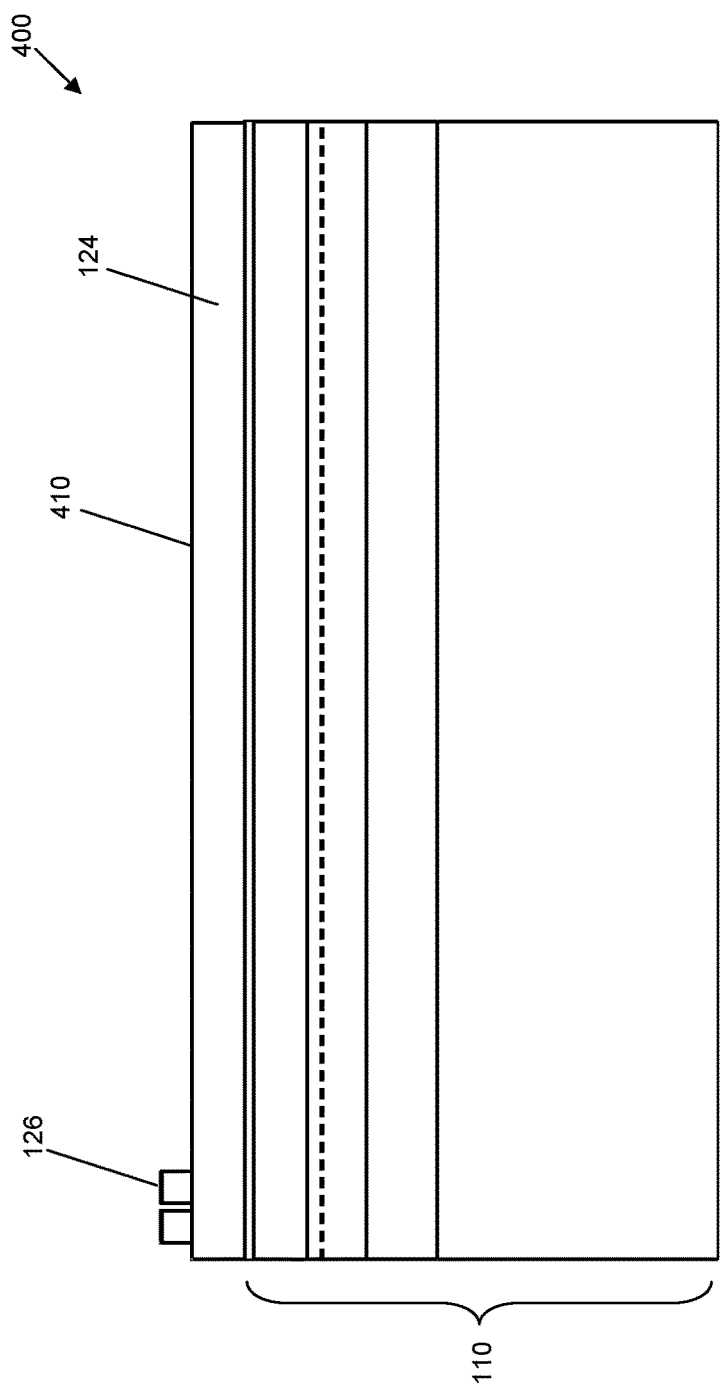
Figure 5:
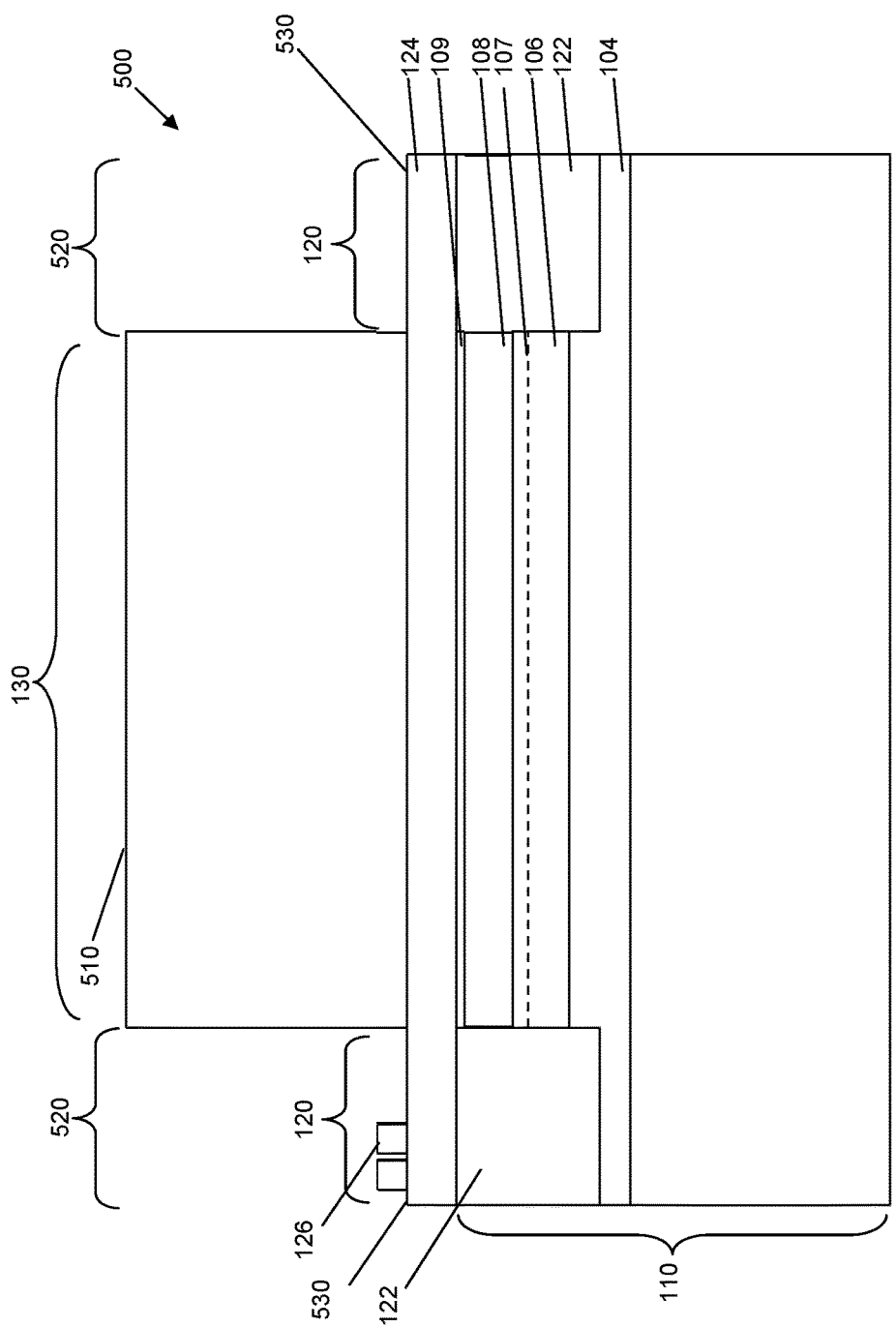

Referring now to FIG. 4, a step 400 of the method of fabricating GaN transistor device 100 further includes depositing initial alignment marks 126 over the first dielectric layer 124, according to an embodiment. Initial alignment marks 126 provide structures that, when used in conjunction with the alignment system of a lithography tool, scatter incident photons or electrons that the lithography tool uses to locate the already processed portions of a reticle relative to the mask level(s) that will be defined by the lithography tool. Thus, the mask levels defined by the lithography tool will be appropriately aligned to mask levels already processed on the wafer and subsequent mask levels may be aligned to the mask level that is aligned to initial alignment marks 126. According to an embodiment, initial alignment marks 126 may be used to align subsequent layers that have poor contrast such as implant isolation or mesa isolation layers, as depicted in FIG. 5 and described in conjunction with step 500, to the mask level used to define ohmic contact 150. In an embodiment, initial alignment marks 126 may be fabricated using one of Si, Au, Ti, Pt, Cr, Ni, or W a combination of these or other material(s). In an embodiment, these materials used to form initial alignment marks 126 may be chosen such that they will allow sufficient contrast so as to be detected by lithography tools as well as have adequate adhesion to an upper surface 410 of first dielectric layer 124. The thickness of initial alignment marks 126 may be in the range of about 200 to about 5000 angstroms although other thicknesses may be used. In other embodiments, initial alignment marks 126 may be formed by etching into first dielectric layer 124 and or semiconductor substrate 110, and depositing one of the above-listed or other materials in the openings. In still other embodiments, metal or dielectric layers deposited in subsequent fabrication steps may also be used to form alignment marks that have the same functional characteristics as initial alignment marks 126.

Referring now to FIG. 5 and step 500, the method of fabricating GaN transistor device 100 further includes dispensing resist layer 510 over semiconductor substrate 110, patterning resist layer 510, and then using an ion implantation process to implant species into first dielectric layer 124 into semiconductor substrate 110 though openings 520 created in resist layer 510 to create isolation regions 122 and active region 130. According to an embodiment, resist layer 510 may include one or more layers of photo-resist with a thickness that ranges from about 0.2 microns to about 10 microns; however electron beam resist or other suitable patterning materials of other thicknesses also may be used. Patterning resist layer 510 may include applying a mask over resist layer 510, exposing unmasked portions of resist layer 510 to an appropriate dose of photon or electron beam irradiation and then developing resist layer 510 with an appropriate developer. In an embodiment, initial alignment marks 126 may be used to register openings 520 to subsequent mask levels. A plasma de-scum process may be used to remove residual traces of undeveloped resist material from the exposed upper surfaces 530 of first dielectric 124.

According to an embodiment, isolation regions 120 may be formed by implanting an ion species at an energy sufficient to drive the species through first layer dielectric 124 and into cap layer 109, barrier layer 108, channel layer 106, and buffer layer 104 thus damaging the crystal lattice for these layers, disrupting channel 107 within the isolation regions 120, and creating high resistivity regions 122 within semiconductor substrate 110. According to an embodiment, one of N, boron (B), helium (He), hydrogen (H), or a combination of these or one or a combination of other suitable ion species may be implanted through openings 520 in resist layer 510 to create high resistivity regions 122 in the semiconductor substrate 110. The depth of the high resistivity regions 122 depends on the thicknesses of first dielectric layer 124, cap layer 109, barrier layer 108, channel layer 106, and buffer layer 104 as well as the accelerating potential and mass of the ion species implanted into semiconductor substrate 110. Both the presence of the implanted species as well as the damage caused within the crystal lattice within semiconductor substrate 110 render the high resistivity regions 122 semi-insulating, thus forming isolation regions 120. In other embodiments (not shown), isolation regions 120 are formed by removing (e.g., etching) first dielectric 124, cap layer 109, barrier layer 108, channel layer 106, and buffer layer 104 within the isolation regions 120 to remove channel 107 within the isolation regions 120. The remaining areas protected by resist layer 510 that are not exposed to ion implantation, etching, or otherwise rendered high resistivity or removed are included in the active region 130. After formation of the isolation regions, resist layer 510 is removed.

Figure 6:
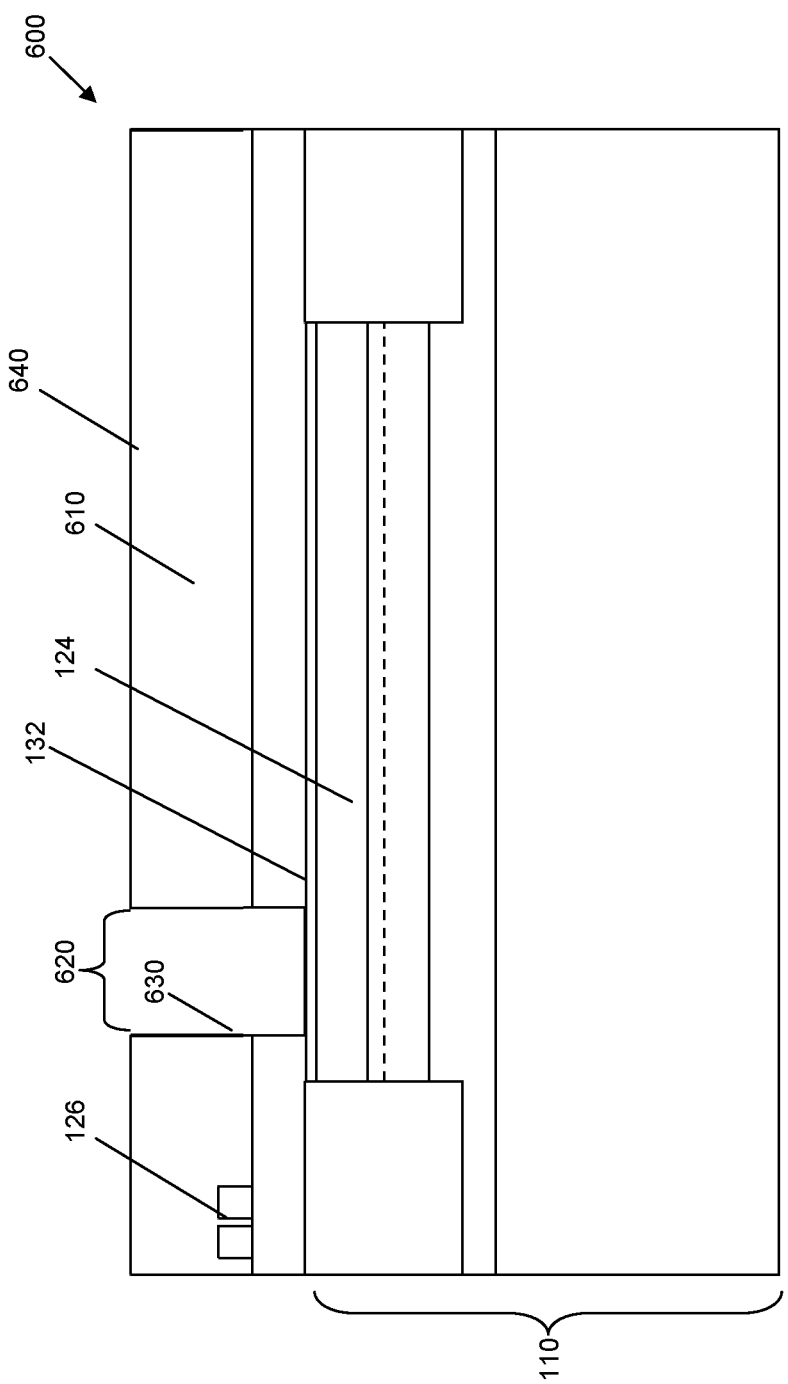
Figure 7:
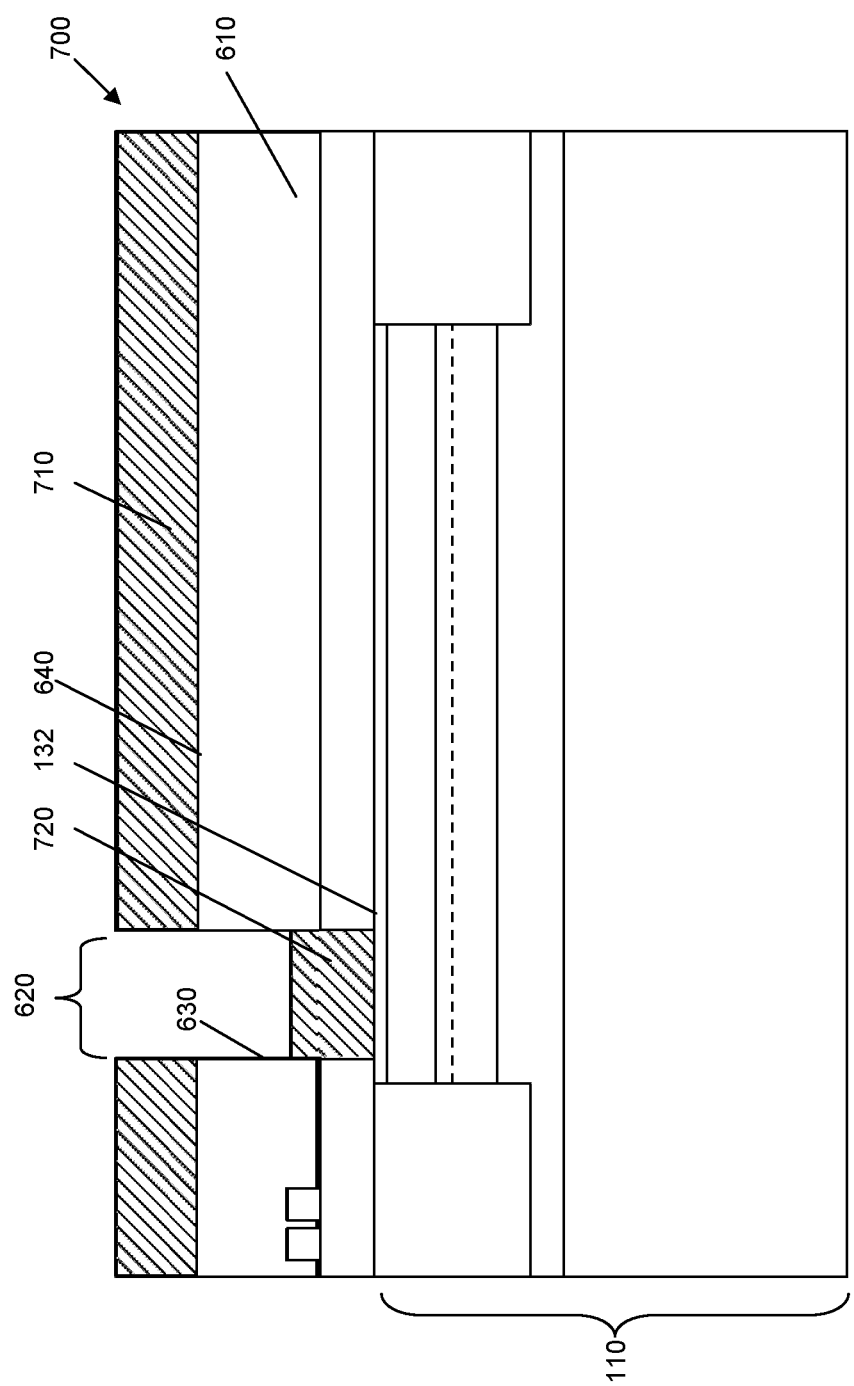
Figure 8:
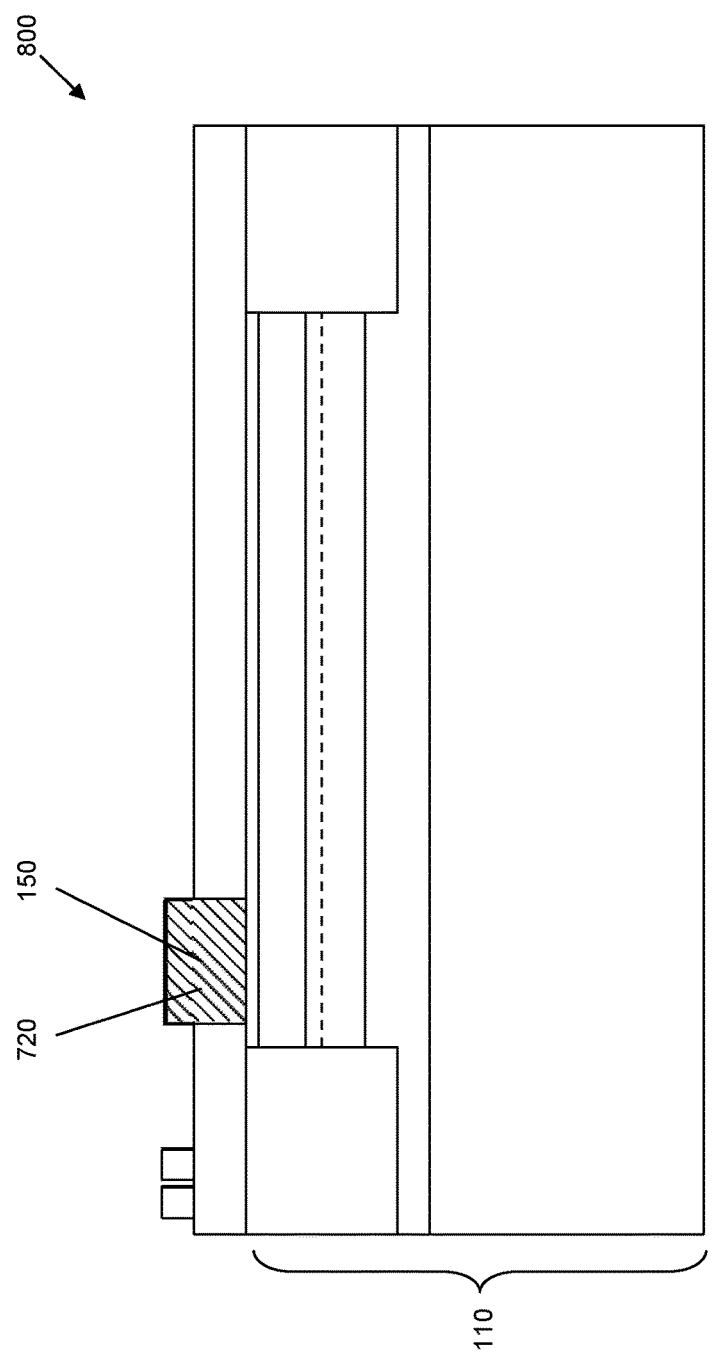

Referring now to FIGS. 6-8 and steps 600-800, the method of fabricating GaN transistor device 100 further includes forming ohmic contact 150. FIG. 6 depicts creating an opening 620 for forming the ohmic contact 150 of FIG. 1. In an embodiment, the opening 620 is created by dispensing resist layer 610 over semiconductor substrate, patterning resist layer 610 and then using an etch process to remove a portion of dielectric layer 124 (within the opening 620) thus exposing an upper surface 132 of semiconductor substrate 110 within the opening 620. According to an embodiment, resist layer 610 may include one or more layers of photo-resist with a thickness that ranges from about 0.5 microns to about 10 microns, however electron beam resist or other suitable patterning materials or of other thicknesses may be used. Patterning the resist layer 610 to create an opening 620 may include applying a mask over resist layer 610, exposing unmasked portions of resist layer 610 with an appropriate dose or doses of photon and/or electron beam irradiation and then developing the resist layer 610 with an appropriate developer(s). In an embodiment, the opening 620 may be aligned to isolation regions 120 using initial alignment marks 126. In an embodiment, a "lift-off profile" is used to create a profile for the sidewalls 630 within the opening 620 such that the opening 620 is slightly larger at the bottom of the opening 620 near the upper surface 132 of semiconductor substrate 110 than at the upper surface 640 of resist layer 610. The lift-off profile ensures that subsequent deposition of metal will not create metal connection bridges between metal deposited over the upper surface 640 of resist layer 610 and within opening 620 over and in contact with semiconductor substrate 110. A plasma de-scum process may be used to remove residual traces of undeveloped resist material from the exposed upper surface of the first dielectric 124 within opening 620 (not shown). In an embodiment, the first dielectric layer 124 is removed using an appropriate dry or wet etch technique or a combination of both. In an embodiment, dry etching of first dielectric layer 124 to expose a portion of the upper surface 132 of the semiconductor substrate 110 may include reactive ion etching (ME), inductively coupled plasma (ICP) etching, electron-cyclotron resonance (ECR) etching or a combination of these techniques, though other suitable techniques may be used. Suitable fluorine (F)-based dry etch chemistries such as sulphur hexafluoride ($SF_6$), carbon hexafluoride ($C_2F_6$), carbon tetrafluoride ($CF_4$), or other suitable dry etch chemistries may be used. The dry etch chemistries may be supplemented with argon (Ar) or oxygen ($O_2$) or a combination of these or other suitable gases to prevent polymer formation within the opening 620 when etching the first dielectric layer 124. Wet etching of the first dielectric layer 124 may be accomplished using hydrofluoric acid (HF), dilute HF, buffered oxide etch (BOE), hot phosphoric acid ($H_3PO_4$), or other suitable wet chemistry technique. In an embodiment, where the first dielectric layer 124 includes SiN deposited on top of $Al_2O_3$, the first dielectric layer 124 may be etched using an F-based dry etch such as RIE, ICP, or ECR to remove the SiN followed by a BOE wet etch to remove the $Al_2O_3$ to expose the portion of the upper surface 132 of the semiconductor substrate 110 underlying opening 620.

FIG. 7 depicts depositing an ohmic metal layer 710 to form a contact 720, according to an embodiment. In an embodiment, the ohmic metal layer 710 is deposited over and in contact with resist layer 610 and into the opening 620 in contact with the exposed portion of the upper surface 132 of the semiconductor substrate 110. In an embodiment, the ohmic metal layer 710 may include a multi-layer stack metal layer of titanium (Ti), Al, molybdenum (Mo), and Au although other suitable materials known in the art may be used. In an embodiment, the thickness of the Ti layer may range from about 50 to about 500 angstroms, the thicknesses of the Al layer may range from about 500 to about 5000 angstroms, the thicknesses of the Mo layer may range from about 500 to about 1000 angstroms, and the thickness of the Au layer may range from about 500 to about 1000 angstroms although other ranges of thicknesses may be used for each layer. In some embodiments, one or more of the Ti, Al, Mo, or Au layers may be omitted or substituted for other suitable materials. In an embodiment, the multi-layer stack of metals may be deposited by evaporation, sputtering, PVD, ALD, or other suitable deposition techniques. In an embodiment, the excess regions of ohmic metal layer 710 not within the opening 620 may be removed using a "lift-off" technique by immersing the wafer in solvents that penetrate resist layer 610 through sidewalls 630 (and/or other sidewalls, not illustrated) in the resist layer 610. This causes the ohmic metal layer 710 that was in contact with the upper surface 640 of resist layer 610 but not directly in contact with semiconductor substrate 110 to wash away. Contact 720 (or the portion of ohmic metal layer 710 that is directly in contact with semiconductor substrate 110) remains on the upper surface of the semiconductor substrate 110. In other embodiments, other techniques known in the art such as etching may be used to pattern contact 720.

As depicted in FIG. 8, step 800 includes annealing contact 720 to form an ohmic contact 150, according to an embodiment. In an embodiment, annealing contact 720 includes loading the semiconductor substrate 110 with contact 720 into a rapid thermal annealing system (RTA) or thermal furnace and raising the temperature of the semiconductor substrate 110 and contact 720 to an appropriate temperature in the presence of a suitable ambient gas or mixture. In an embodiment, an RTA may be used to anneal contact 720 to form ohmic contact 150 at a temperature between about 500 and about 900 degrees Celsius (° C.) for 15 to 120 seconds though other suitable temperatures and times may be used.

In an embodiment, the RTA may use one of nitrogen ($N_2$), oxygen ($O_2$), or forming gas ambient, though a combination of these or other suitable ambient gas may be used. In an embodiment, the time, temperature, and ambient gas are optimized to create an ohmic junction between ohmic contact 150 and channel 107 with ohmic contact resistance between about 0.05 and about 1.00 ohm-mm though other contact resistance values may be used.

Figure 9:
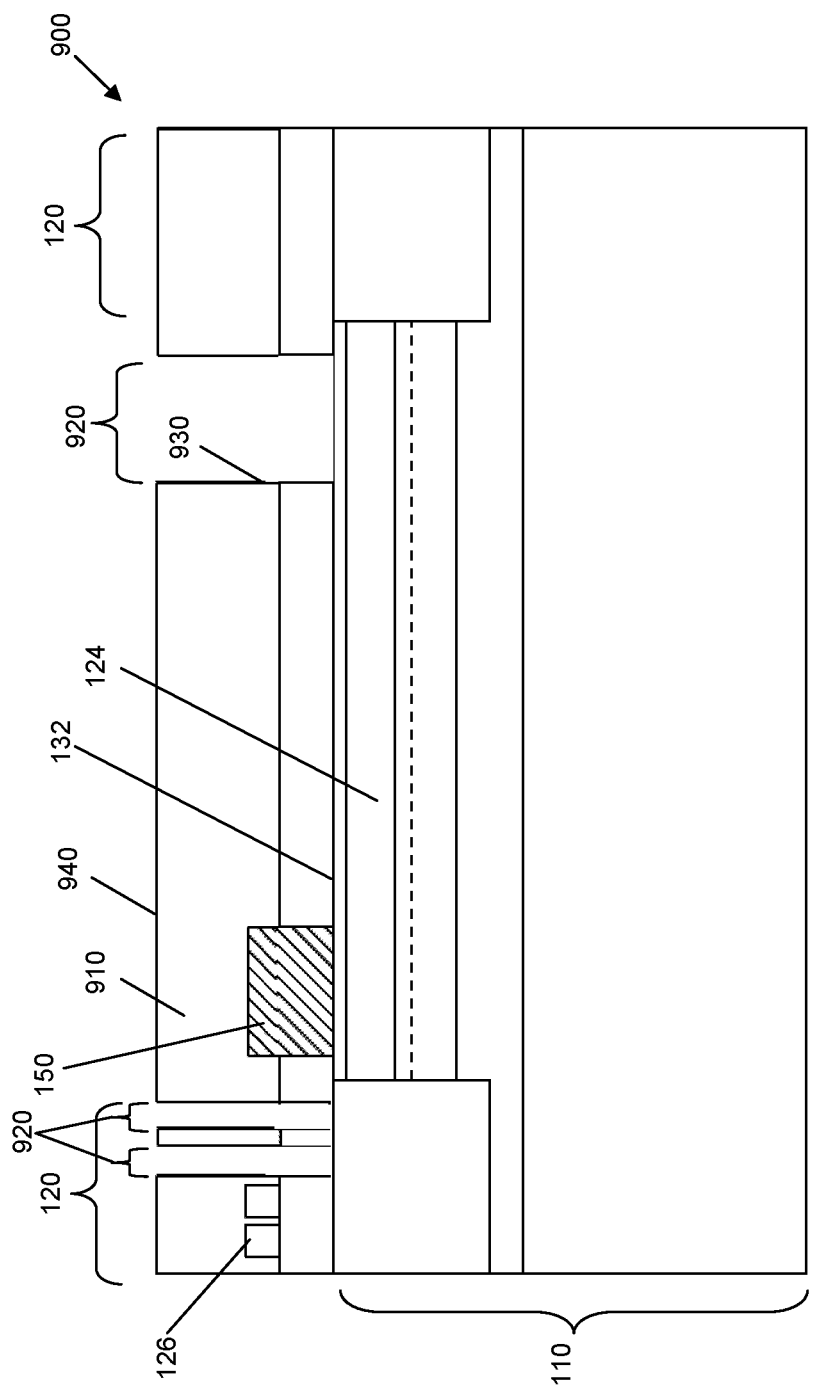
Figure 11:
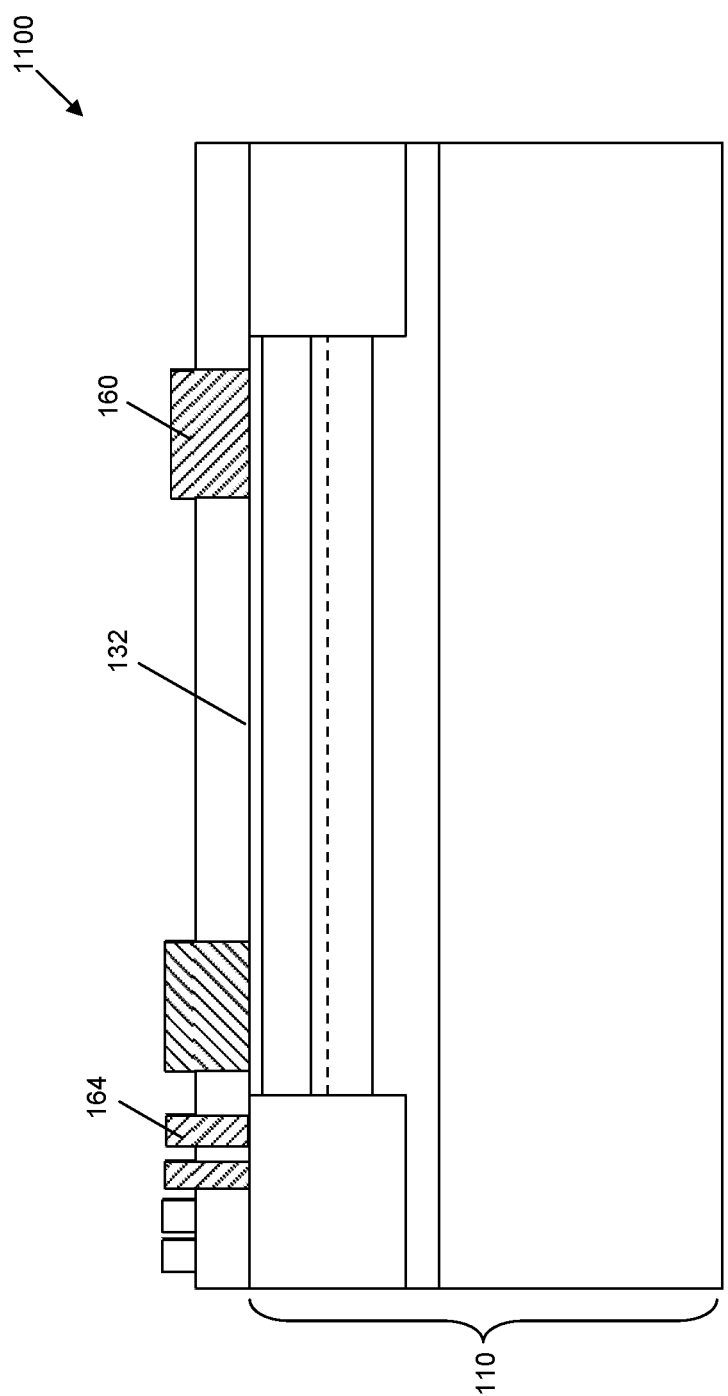

Referring now to FIGS. 9-11 and steps 900-1100, the method of fabricating GaN transistor device 100 further includes forming Schottky contact 160 and one or more alignment marks 164, according to an embodiment. As depicted in FIG. 9, step 900 includes creating one or more openings 920 for eventually forming Schottky contact 160 and alignment marks 164 of FIG. 1. In an embodiment, the openings 920 are created by dispensing resist layer 910 over the semiconductor substrate 110, patterning resist layer 910, and then using an etch process to remove portions of the dielectric layer 124 within openings 920, thus exposing portions of the upper surface 132 of semiconductor substrate 110 underlying the openings 920. According to an embodiment, the resist layer 910 may include one or more layers of photo-resist with a thickness that ranges from about 0.2 microns to about 10 microns, however electron beam resist or other suitable patterning materials or of other thicknesses may be used. Patterning resist layer 910 to create openings 920 may include applying a mask over resist layer 910, exposing unmasked portions of resist layer 910 to one or more doses of photon and/or electron beam radiation and then developing resist layer 910 with an appropriate developer(s). In an embodiment, openings 920 may be aligned to ohmic contact 150 and isolation regions 120 using initial alignment marks 126 or the openings 920 may be aligned directly to ohmic contact 150. In an embodiment, a "lift-off profile" is used to create a retrograde profile for the sidewalls 930 within the openings 920 such that openings 920 are slightly larger at the bottom of the openings 920 near upper surface 132 of semiconductor substrate 110 than at the upper surface 940 of resist layer 910. The lift-off profile ensures that subsequent deposition of metal will not create metal connection bridges between metal deposited on the upper surface 940 of resist layer 910 and metal deposited within openings 920 over and in contact with semiconductor substrate 110. A plasma de-scum process may be used to remove residual traces of undeveloped resist material from the exposed portions of the upper surface of first dielectric 124 within the openings 920 (not shown). In an embodiment, the portions of the first dielectric layer 124 within the openings 920 are removed using an appropriate dry or wet etch technique or a combination of both. In an embodiment, dry etching of first dielectric layer 124 to expose an upper portion 132 of semiconductor substrate 110 may include ME, ICP etching, ECR etching or a combination of these techniques, though other suitable techniques may be used. Suitable F-based dry etches such as $SF_6$, $C_2F_6$, $CF_4$, or other suitable dry etch chemistries may be used. The dry etch chemistries may be supplemented with Argon (Ar) or $O_2$ to prevent polymer formation. Wet etching of first dielectric layer 124 may be accomplished using HF, BOE, hot phosphoric acid, or other suitable wet chemistry technique. In an embodiment, where first dielectric layer 124 includes SiN deposited on top of $Al_2O_3$, first dielectric layer 124 may be etched using a F-based dry etch such as $SF_6$ in an RIE, ICP, or ECR system to remove the SiN followed by a BOE wet etch to remove the $Al_2O_3$ to expose upper surface 132 of semiconductor substrate 110.

As depicted in FIG. 10, step 1000 includes depositing Schottky metal layer 1010 to form Schottky contact 160 and alignment marks 164, according to an embodiment. In an embodiment, Schottky metal layer 1010 is deposited over and in contact with resist layer 910 and into openings 920 in contact with the upper surface of semiconductor substrate 110. The Schottky metal layer 1010 may be a multi-layer stack that includes one or more metal layers. A first metal layer within Schottky metal layer 1010 that contacts semiconductor substrate 110 may include nickel (Ni), platinum (Pt), copper (Cu), palladium (Pd), chromium (Cr), tungsten (W), iridium (Ir), nickel silicide ($Ni_XSi_Y$), titanium, or rhenium (Re), a combination of these, or other suitable high work function materials. The first metal layer may be between about 50 and about 1000 angstroms in thickness, although other thickness values may be used. One or more conductive layers may be deposited over the first metal layer within Schottky metal layer 1010, according to an embodiment. Conductive layers may also include substantially conductive layers including Au, Ag, Al, Cu, or other substantially conductive materials. The conductive layer(s) may be between about 30 and 10,000 angstroms in thickness, although other thickness values may be used. Optionally, barrier metal layer(s) may be deposited after the first metal layer and before the conductive metal layer(s), where the barrier metal layer(s) may include materials such as Ni, Pt, Cu, Pd, Cr, W, Ir, nickel silicide ($Ni_XSi_Y$) or other substantially refractive materials that act as a barrier between the first metal layer that contacts semiconductor substrate 110 and the conductive layer(s). The barrier metal layer(s) may be between about 30 and about 10,000 angstroms in thickness, although other thickness values may be used. In an embodiment, the various layers used to form Schottky metal layer 1010 may be deposited by evaporation, sputtering, PVD, ALD, or other suitable deposition technique(s). In an embodiment, the excess regions of Schottky metal layer 1010 not within the openings 920 may be removed using a "lift-off" technique by immersing the wafer in solvents that penetrate resist layer 910 through sidewalls 930 (and/or other sidewalls, not illustrated) in the resist layer 910. This causes the Schottky metal layer 1010 in contact with the upper surface 940 of resist layer 910 and not directly in contact with an upper surface 132 of semiconductor substrate 110 in openings 920 to wash away. In other embodiments, other techniques known in the art such as etching may be used to pattern Schottky contact 160.

As depicted in FIG. 11, step 1100 includes optionally annealing Schottky contact 160 (and those portions of the Schottky metal layer 1010, including alignment marks 164, that remain on an upper surface 132 of the semiconductor substrate 110 after the lift-off or other appropriate patterning technique), according to an embodiment. Annealing Schottky contact 160 includes loading the semiconductor substrate 110 with Schottky contact 160 and alignment marks 164 into a RTA or thermal furnace, raising the temperature of the semiconductor substrate 110 and Schottky contact 160 to an appropriate temperature in the presence of a suitable ambient gas or mixture. In an embodiment, an RTA may be used to anneal Schottky contact 160 at a temperature between about 200° C. and about 600° C. for about 15 seconds to about two hours though other suitable temperatures and times may be used. In an embodiment, the RTA may use one of $N_2$, $O_2$, air, or forming gas, though a combination of these or other suitable ambient gas(es) may be used. In an embodiment, the time, temperature, and ambient gas may be optimized to stabilize barrier height and leakage of Schottky contact 160.

Figure 12:
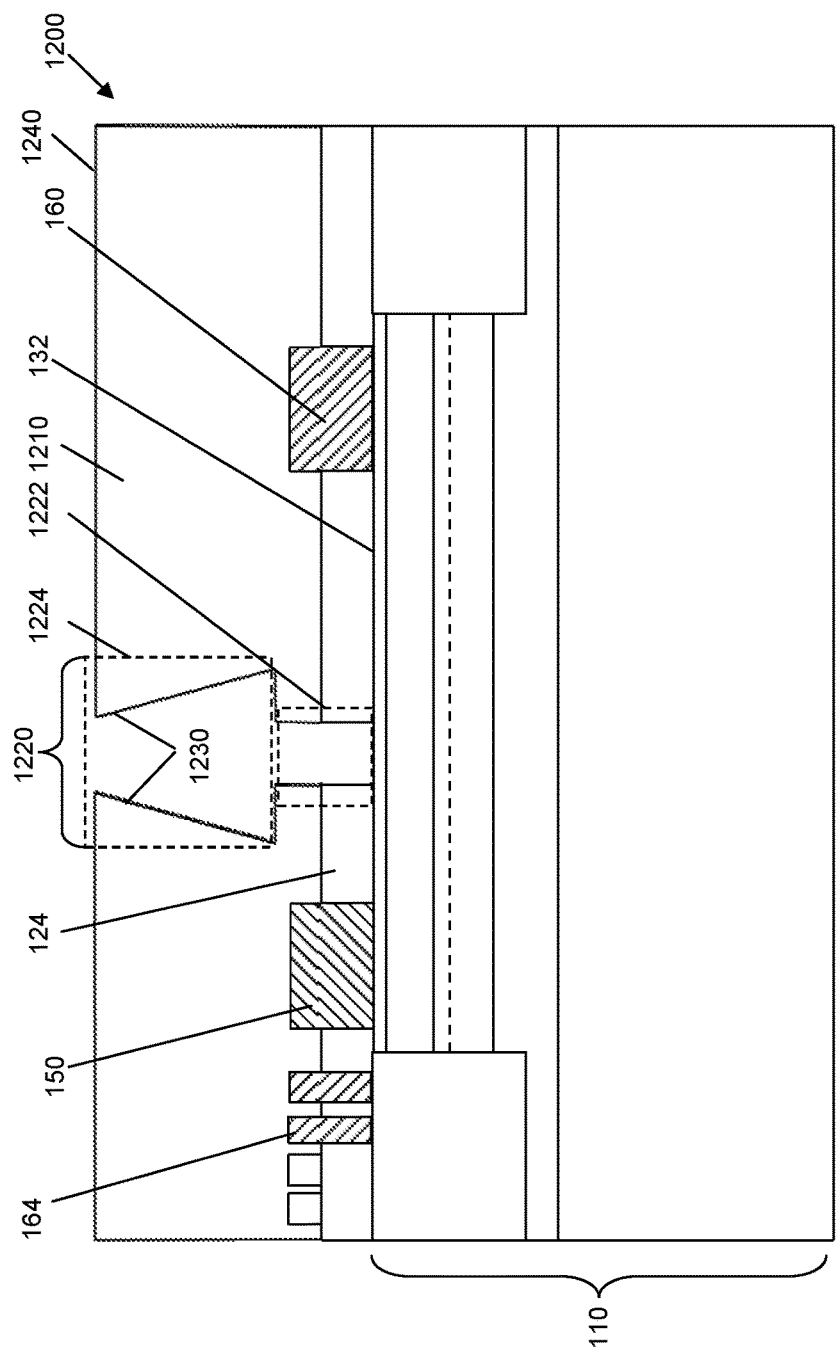

Referring now to FIGS. 12-13 and steps 1200-1300, the method of fabricating GaN transistor device 100 further includes forming gate electrode 140 according to an embodiment. FIG. 12 depicts step 1200 that includes depositing resist layer 1210 and creating opening 1220 for eventually forming gate electrode 140 of FIG. 1. In an embodiment, opening 1220 is created by placing resist layer 1210 over semiconductor substrate 110, patterning resist layer 1210, and then using an etch process to remove portions of dielectric layer 124 within the lower portion of opening 1220, thus exposing portions of the upper surface 132 of semiconductor substrate 110 within opening 1220. According to an embodiment, resist layer 1210 may include one or more layers of electron beam resist with a thickness that ranges from about 0.1 microns to about 3 microns, however optical photo resist or other suitable patterning materials this or of other thicknesses may be used. According to an embodiment, patterning resist layer 1210 to create opening 1220 may include applying a mask to resist layer 1210, exposing unmasked portions of resist layer 1210 to one or more doses of photon and/or electron beam radiation and then developing resist layer with an appropriate developer(s). In an embodiment, openings 1220 may be aligned to ohmic contact 150, Schottky contact 160, and isolation regions 120 using alignment marks 164.

In an embodiment, a "T-gate" profile may be used to create a retrograde profile for the sidewalls 1230 within the opening 1220 such that a lower portion 1222 of the opening 1220 defines the portion of gate electrode 140 that contacts the upper surface 132 of semiconductor substrate 110 and an upper portion 1224 of opening 1220 defines a longer low resistance portion of the gate electrode 140 opening above the lower portion of gate electrode 140. According to an embodiment, the distance between sidewalls 1230 in the lower portion 1222 of the opening 1220 that defines the gate length may be between about 0.01 and about 2 microns. The distance between sidewalls 1230 in the upper portion 1224 of opening 1220 that defines the top of the T-gate may be between about 0.01 and 1 about micron longer than the distance between sidewalls 1230 in the lower portion 1222 of opening 1220. The T-gate profile also helps to ensure that subsequent deposition of gate metal will not create metal connections between metal deposited on the upper surface 1240 of resist layer 1210 and metal deposited within opening 1220 over and in contact with semiconductor substrate 110. In other embodiments (not shown), the gate electrode opening in resist layer 1210 may be configured to form a square gate in the gate electrode opening, rather than having a T-gate profile like opening 1220, would include only a single resist layer with a lift-off profile portion with a width of about 0.01 to about 2 microns at the bottom portion of the opening closest to an upper surface of semiconductor substrate 110, narrowing slightly at the top of the opening to create a retrograde profile. After patterning the resist layer 1210 to form opening 1220, a plasma de-scum process may be used to remove residual traces of undeveloped resist from the exposed upper surface of first dielectric 124 (not shown). In an embodiment, the first dielectric layer 124 below the lower portion 1222 of opening 1220 is removed to expose a portion of the upper surface 132 of semiconductor substrate 110 using an appropriate dry or wet etch technique or a combination of both. In an embodiment, dry etching of first dielectric layer 124 to expose the portion of the upper surface 132 of semiconductor substrate 110 may include RIE, ICP etching, ECR etching or a combination of these techniques, though other suitable techniques may be used. Suitable dry etches based on F-based chemistry such as $SF_6$, $C_2F_6$, $CF_4$, or other suitable dry etch chemistries may be used. The dry etch chemistries may be supplemented with Ar or $O_2$ to prevent polymer formation. Wet etching of first dielectric layer 124 may also be accomplished using HF, BOE, hot phosphoric acid, or other suitable wet chemistry techniques. In an embodiment, where first dielectric layer 124 includes SiN deposited over $AlO_3$ where $Al_2O_3$ contacts the upper surface 132 of semiconductor substrate 110, the first dielectric layer 124 may be etched using an F-based dry etch such as $SF_6$ in an RIE, ICP, or ECR system to remove the SiN followed by a BOE wet etch to remove the $Al_2O_3$ to expose the upper surface 132 of semiconductor substrate 110.

FIG. 13 depicts step 1300 that includes depositing a gate electrode layer 1310 to form the gate electrode 140, according to an embodiment. In an embodiment, the gate electrode layer 1310 is deposited over and in contact with resist layer 1210 and into opening 1220 in contact with the portion of the upper surface 132 of semiconductor substrate 110 that is exposed through the opening 1220. The gate electrode layer 1310 may be a multi-stack that includes one or more metal layers and/or other suitable materials. A first layer within gate electrode layer 1310 that contacts semiconductor substrate 110 may include Ti, Ni, Pt, Cu, Pd, Cr, W, Ir, $Ni_XSi_Y$, poly-silicon or other suitable materials. The first layer may be between about 50 and about 1,000 angstroms in thickness, although other thickness values may be used. One or more layers that act as conductive layers may be deposited over the first layer in gate electrode layer 1310, according to an embodiment. Conductive layers may also include substantially conductive layers including Au, Ag, Al, Cu, Ti or other substantially conductive materials. The conductive layer may be between about 50 and about 20,000 angstroms in thickness, although other thickness values may be used. Optionally, one or more barrier metal layers may be placed between the first layer and the conductive layer(s), where the barrier metal layer(s) may include materials such as Ni, Pt, Cu, Pd, Cr, W, Ir, $Ni_XSi_Y$ or other substantially refractive materials that act as a barrier between the portion of the first metal layer that contacts semiconductor substrate 110 and the conductive layer(s). The barrier metal layers may be between about 50 and about 10,000 angstroms in thickness, although other thickness values may be used. In an embodiment, the various layers used to form gate electrode layer 1310 may be deposited by evaporation, sputtering, PVD, ALD, or other suitable deposition technique(s). In an embodiment, the excess regions of gate electrode layer 1310 not within the opening 1220 (e.g., regions on the top surface 1240 of the resist layer 1210) may be removed using a "lift-off" technique by immersing the wafer in solvents that penetrate resist layer 1210 through sidewalls 1230 (and/or other sidewalls, not illustrated) in the resist layer 1210 thus causing portions of the gate electrode layer 1310 that were in contact with the upper surface 1240 of resist layer 1210 and not directly in contact with an upper surface 132 of semiconductor substrate 110 in openings 1220 to wash away (not shown). In other embodiments, other techniques known in the art such as etching may be used to pattern gate electrode 140.

In an embodiment, annealing may be used to stabilize gate electrode 140 analogous to annealing (not shown) in FIG. 8, step 800. Annealing gate electrode 140 includes placing the semiconductor substrate 110 with gate electrode 140 into a RTA or thermal furnace, raising the temperature of the semiconductor substrate 110 and gate electrode 140 to an appropriate temperature in the presence of a suitable ambient gas or mixture. In an embodiment, an RTA may be used to anneal gate electrode 140 at a temperature between about 200° C. and about 600° C. for 15 seconds to about 2 hours, although other suitable temperatures and times may be used. In an embodiment, the RTA may use one of $N_2$, $O_2$, air, or forming gas ambient, though a combination of these or other suitable ambient(s) may be used. In an embodiment, the time, temperature, and ambient gas are optimized to stabilize the gate electrode 140.

As depicted in FIG. 14, step 1400 includes patterning and forming first metal electrodes 170 over the Schottky contact 160, ohmic contact 150, and first dielectric 124 according to an embodiment. In an embodiment, patterning first metal electrodes 170 may be accomplished by applying and patterning resist layers over semiconductor substrate 110 in a lift-off configuration analogous to steps 600 and 900 in FIGS. 6 and 9 (not shown). In an embodiment, first metal electrodes 170 may be formed by metal layers analogous to the descriptions of steps 700 and 1000 in FIGS. 7 and 10 for forming ohmic metal layer 710 and Schottky contact layer 1010 (not shown). In an embodiment, the first metal electrodes 170 are formed by depositing adhesion and conductive metal layers into openings patterned into the resist layers applied to the wafer as described above (not shown). In an embodiment, the adhesion layer may be deposited first and is followed by deposition of the conductive layer(s). In an embodiment, the adhesion and conductive layers may be deposited in the same deposition step. The adhesion layer may include one of Ti, Ni, Cr or other suitable adhesion layer material(s). The adhesion layer may be between about 50 and about 2,000 angstroms in thickness, although other thickness values may be used. The conductive layer(s) may include Cu, Au, Al, or Ag, although other suitable materials may be used. The conductive layer(s) may be between about 200 and about 40,000 angstroms in thickness, although other thickness values may be used. The adhesion and conductive layers that form first metal electrodes 170 are deposited over and in contact with first dielectric layer 124 (e.g. to form the bottom plate 1410 of MIM capacitor 128), ohmic contact 150, and Schottky contact 160. In an embodiment, the adhesion layer and conductive layer(s) may be formed by sputtering, evaporation, or electro-plating. In an embodiment, the resist layers and metals deposited over the resist and not included with first metal electrodes 170 are removed using solvents analogous to steps 700 and 1000 in FIGS. 7 and 10 (not shown). In other embodiments, first metal electrodes 170 may be formed by depositing adhesion and conductive layers that are then patterned by suitable dry or wet chemical etching techniques.

As depicted in FIG. 15, step 1500 includes depositing a second dielectric layer 180 over first metal electrodes 170, Schottky contact 160, alignment marks 164, ohmic contact 150, first dielectric 124, and semiconductor substrate 110 according to an embodiment. The second dielectric layer 180 may include one of $Si_3N_4$, $SiO_2$, SiON, $Al_2O_3$, a combination of these, or other suitable insulating dielectric layer(s). The second dielectric layer 180 may have a total thickness of between about 100 and about 20,000 angstroms although other thickness values may be used. The second dielectric layer 180 may formed using PECVD, ALD, ICP, ECR, Cat-CVD, HWCVD, sputtering, or other suitable deposition technique.

As depicted in FIG. 16, step 1600 includes forming second metal electrodes 190 over first metal electrodes 170, according to an embodiment. More specifically, at least some second metal electrodes 190 may be formed to directly contact the first metal electrodes 170 that are coupled to ohmic contact 150 and Schottky contact 160, and another second metal electrode 190 may be formed over a portion of the second dielectric layer 180 to provide a top electrode of MIM capacitor 128. In an embodiment, to form the metal electrodes 190 that directly contact the first metal electrodes 170 that are electrically coupled to ohmic contact 150 and Schottky contact 160, the second dielectric layer 180 may be patterned by placing a resist layer (not shown) over second dielectric layer 180, and patterning the resist layer to form openings to portions of the second dielectric layer 180 over the first metal electrodes 170 that are in contact with ohmic contact 150 and Schottky contact 160 (e.g., using a technique analogous to the patterning of the resist layer 510 to form openings 520 depicted in FIG. 5 and step 500). The second dielectric layer 180 may then be etched through the openings using a technique analogous to the etching of first dielectric 124 as depicted in FIGS. 6 and 9 and steps 600 and 900.

In an embodiment, second metal electrodes 190 may be formed by depositing an adhesion layer of Ti, Ni, or Cr and then a second conductive layer of Cu, Au, Al, although other suitable materials may be used. The adhesion layer may be between about 100 and about 2,000 angstroms in thickness, although other thickness values may be used. The conductive layer may include Cu, Au, Al, or Ag, although other suitable materials may be used. The conductive layer may be between about 1000 and about 100,000 angstroms in thickness, although other thickness values may be used. The second metal electrodes 190 may be formed by sputtering, evaporation, electro-plating, or other suitable technique. In an embodiment, forming second metal electrodes 190 may be accomplished by electro-plating, although other techniques such as lift-off may be used. In other embodiments, second metal electrodes 190 may be deposited using a blanket film that is then patterned by suitable dry or wet chemical etching techniques known in the art.

Additional process steps (not shown) may be employed to deposit additional metal layers for additional connections between gate electrode 140, first metal electrodes 170, second metal electrodes 190 and other circuitry that may be electrically coupled to GaN transistor device 100. Additional process steps for depositing and patterning one or more additional layers of dielectric for moisture and chemical protection may also be employed. The additional dielectric layer(s) may include one of silicon nitride ($Si_3N_4$), silicon dioxide ($SiO_2$), aluminum oxide ($Al_2O_3$), a combination of these or other suitable insulating dielectric layer(s). The additional dielectric layer(s) may have a total thickness of between about 100 and about 20,000 angstroms although other thickness values may be used. The additional dielectric layer(s) may be formed using PECVD, ALD, ICP, ECR, Cat-CVD, HWCVD, sputtering, or other suitable deposition techniques.

Various embodiments of a semiconductor device have been disclosed. An embodiment of the semiconductor device includes a semiconductor substrate with an upper surface and a channel, a gate electrode disposed over the semiconductor substrate electrically coupled to the channel, and a Schottky metal layer disposed over the semiconductor substrate adjacent the gate electrode. The Schottky metal layer forms a Schottky contact electrically coupled to the channel forming a Schottky junction and at least one alignment mark disposed over the semiconductor substrate. An embodiment may include an active region that includes the gate electrode and the Schottky contact. An embodiment may include an isolation region that includes the alignment mark. An embodiment may include a Schottky metal layer that includes a metal with a work function of at least 4.5 electron volts in contact with the upper surface of the semiconductor substrate. An embodiment may include a gate electrode configured as a Schottky gate. An embodiment may include an ohmic contact electrically coupled to the channel. An embodiment may include a Schottky contact configured to form a drain terminal. An embodiment may include a Schottky contact configured as a source terminal. An embodiment may include a semiconductor substrate with one or more layers selected from Ga-polar group III-nitride semiconductors or N-polar group III-nitride semiconductors. An embodiment may include a semiconductor substrate with a channel layer and a barrier layer adjacent the channel layer, wherein the upper surface of the semiconductor substrate is over the barrier layer.

Another embodiment of the inventive subject matter may include a gallium nitride (GaN) transistor device. According to an embodiment, the GaN transistor device may include a semiconductor substrate with an upper surface comprising a host substrate and a group III nitride semiconductor epitaxial layer disposed over the host substrate and configured to include a channel, an isolation region defining an active region along an upper surface of the semiconductor substrate, a gate electrode disposed over the semiconductor substrate in the active region, and a Schottky metal layer disposed over the semiconductor substrate in the active region adjacent the gate electrode. According to an embodiment, the Schottky metal layer may include at least one Schottky contact electrically coupled to the channel in the active region forming a Schottky junction in the active region and at least one alignment mark disposed over the semiconductor substrate in the in the isolation region. In an embodiment, the Schottky metal layer may comprise a nickel layer in contact with the upper surface of the semiconductor substrate. In an embodiment, the GaN transistor device may include a first dielectric layer disposed over the semiconductor substrate. An embodiment may include a channel layer and a barrier layer adjacent the channel layer. In an embodiment, the upper surface of the semiconductor substrate may be over the barrier layer.

An embodiment of a method of fabricating a semiconductor device includes creating an isolation region that defines an active region along an upper surface of a semiconductor substrate, forming a gate electrode over the semiconductor substrate in the active region, and forming a Schottky metal layer over the semiconductor substrate. Forming the Schottky metal layer includes forming at least one Schottky contact electrically coupled to the channel, forming a Schottky junction and an alignment mark. An embodiment of the method may include defining the channel by depositing a group III-nitride channel layer over a host substrate and a group III-nitride barrier layer over the channel layer. An embodiment of the method may include depositing a first dielectric layer over the semiconductor substrate. The first dielectric layer may include low pressure chemical vapor deposition silicon nitride. An embodiment of the method may include etching openings in the first dielectric layer to form a Schottky contact opening and an alignment mark opening. An embodiment of the method may include forming the Schottky contact and alignment mark using a same mask level. An embodiment of the method may include forming the alignment mark in an isolation region.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
    a semiconductor substrate, having an upper surface, comprising:
        a host substrate;
        a buffer layer formed over the host substrate wherein the buffer layer includes at least one additional layer;
        a channel layer formed over the buffer layer;
        a barrier layer formed over the channel layer, forming a channel; and
        a cap layer comprising a semiconductor formed over the barrier layer;
    an ohmic contact formed over and in contact with the semiconductor substrate, recessed through the cap layer and electrically coupled to the channel;
    one or more dielectric layers disposed over the semiconductor substrate; and
    a gate electrode disposed adjacent the ohmic contact and entirely over the cap layer, wherein the gate electrode forms a Schottky contact with the semiconductor substrate, wherein an overhang portion of the gate electrode overlaps and vertically contacts the one or more dielectric layers in a region laterally adjacent the Schottky contact, and wherein the overhang portion of the gate electrode and the one or more dielectric layers forms a metal-insulator stack directly above and in contact with the upper surface of the semiconductor substrate.

2. The semiconductor device of claim 1, wherein the at least one additional layer within the buffer layer contacts the channel layer, and wherein the at least one additional layer has a bandgap that differs from a bandgap of the channel layer.

3. The semiconductor device of claim 1, wherein the buffer layer further comprises one or more layers selected from Ga-polar group III-nitride semiconductors or N-polar group III-nitride semiconductors.

4. The semiconductor device of claim 3, wherein the at least one additional layer includes aluminum gallium nitride.

5. The semiconductor device of claim 4, wherein the aluminum mole fraction of the aluminum gallium nitride of the at least one additional layer has a value between 0.03 and 0.15.

6. The semiconductor device of claim 3, wherein the at least one additional layer includes indium gallium nitride.

7. The semiconductor device of claim 6, wherein the indium mole fraction of the indium gallium nitride of the at least one additional layer has a value between 0.05 and 0.15.

8. The semiconductor device of claim 1, wherein the cap layer comprises GaN.

9. A gallium nitride (GaN) transistor device comprising:
    a semiconductor substrate comprising:
        a host substrate;
        a buffer layer formed over the host substrate wherein the buffer layer includes at least one additional layer;
        a GaN channel layer formed over the buffer layer and in contact with the at least one additional layer, wherein a bandgap of the at least one additional layer differs from a bandgap of the GaN channel layer;
        a barrier layer formed over the channel layer, forming a channel in the channel layer;
        a GaN cap layer formed over the barrier layer;
    an ohmic contact formed over and in contact with the semiconductor substrate, recessed through the GaN cap layer and electrically coupled to the channel;
    an isolation region defining an active region along an upper surface of the semiconductor substrate;
    one or more dielectric layers disposed over the semiconductor substrate; and
    a gate electrode disposed adjacent the ohmic contact and entirely over the cap layer, wherein the gate electrode forms a Schottky contact with the semiconductor substrate, wherein an overhang portion of the gate electrode overlaps and vertically contacts the one or more dielectric layers in a region laterally adjacent the Schottky contact, and wherein the overhang portion of the gate electrode and the one or more dielectric layers forms a metal-insulator stack directly above and in contact with the GaN cap layer.

10. The semiconductor device of claim 9, wherein the at least one additional layer includes aluminum gallium nitride (AlGaN) and wherein the aluminum mole fraction of the AlGaN of the at least one additional layer has a value between 0.03 and 0.1.

11. The semiconductor device of claim 9, wherein the at least one additional layer includes indium gallium nitride (InGaN) and wherein the indium mole fraction of the InGaN of the at least one additional layer has a value between 0.05 and 0.15.

12. The GaN transistor device of claim 9, further comprising a first dielectric layer disposed over the semiconductor substrate.

13. A method of fabricating a semiconductor device, the method comprising:
    providing a host substrate;
    forming a buffer layer over the host substrate wherein the buffer layer includes at least one additional layer;
    forming a GaN channel layer over the buffer layer, wherein a bandgap of the at least one additional layer differs from a bandgap of the channel layer;
    forming a barrier layer-over the channel layer;
    forming a GaN cap layer over the barrier layer;
    recessing through the GaN cap layer; and
    forming an ohmic contact over the channel layer;

forming one or more dielectric layers over the GaN cap layer; and forming a gate electrode entirely over the GaN cap layer adjacent the ohmic contact, wherein a portion of the gate electrode overlaps the first dielectric layer laterally adjacent the Schottky contact, and wherein an overhang portion of the gate electrode overlaps and vertically contacts the one or more dielectric layers in a region laterally adjacent the Schottky contact, and wherein the overhang portion of the gate electrode and the one or more dielectric layers forms a metal-insulator stack directly above and in contact with the GaN cap layer.

14. The method of claim 13, further comprising depositing a first dielectric layer over the GaN cap layer wherein the first dielectric layer comprises low pressure chemical vapor deposition silicon nitride.

15. The method of claim 13, further comprising forming an isolation region to define an active region along an upper surface of the GaN cap layer.

\* \* \* \* \*